United States Patent
Ohgiyama et al.

(10) Patent No.: US 6,907,053 B2
(45) Date of Patent: Jun. 14, 2005

(54) SEMICONDUCTOR LASER DEVICE, AND OPTICAL PICKUP APPARATUS USING THE DEVICE

(75) Inventors: Kenji Ohgiyama, Nagasaki (JP); Kiyoaki Tsumura, Tokyo (JP); Koji Yamashita, Tokyo (JP); Toshio Takeuchi, Kanagawa (JP); Susumu Ishida, Kanagawa (JP); Kenji Kan, Kanagawa (JP)

(73) Assignees: Mitsubishi Denki Kabushiki Kaisha, Tokyo (JP); Mitsumi Electric Co., Ltd., Tokyo (JP)

( * ) Notice: Subject to any disclaimer, the term of this patent is extended or adjusted under 35 U.S.C. 154(b) by 390 days.

(21) Appl. No.: 10/183,509

(22) Filed: Jun. 28, 2002

(65) Prior Publication Data

US 2003/0123499 A1 Jul. 3, 2003

(30) Foreign Application Priority Data

Dec. 28, 2001  (JP) ...................................... 2001-400376

(51) Int. Cl.$^7$ ................................................ H01S 3/04
(52) U.S. Cl. ....................................................... 372/36
(58) Field of Search ...................................... 372/36, 43

(56) References Cited

U.S. PATENT DOCUMENTS

| | | | | |
|---|---|---|---|---|
| 4,594,600 A | * | 6/1986 | Arora | .......................... 347/132 |
| 5,748,658 A | | 5/1998 | Nakanishi et al. | |
| 6,454,468 B1 | * | 9/2002 | Yoon et al. | ................... 385/88 |
| 6,624,491 B2 | * | 9/2003 | Waitl et al. | ................. 257/434 |

FOREIGN PATENT DOCUMENTS

| JP | 6-203403 | 7/1994 |
|---|---|---|
| JP | 2000-36117 | 2/2000 |

* cited by examiner

*Primary Examiner*—James Vannucci
(74) *Attorney, Agent, or Firm*—Leydig, Voit & Mayer, Ltd.

(57) ABSTRACT

A semiconductor laser element and a protective wall surrounding the element are provided on the surface of a metal frame of a semiconductor laser device. Circumferential portions are provided on an outer periphery of the metal frame for rotating the optical axis of light originating from a light-emitting point of the semiconductor laser element to a direction along the surface of the metal frame. By way of a guide of an optical pickup base corresponding to the circumferential portions, the semiconductor laser device is mounted on the optical pickup base.

20 Claims, 24 Drawing Sheets

SEMICONDUCTOR LASER DEVICE, AND OPTICAL PICKUP APPARATUS USING THE DEVICE

BACKGROUND OF THE INVENTION

1. Field of the Invention

The present invention relates to a semiconductor laser device and an optical pickup apparatus using the laser device, and more particularly, to the structure of a mechanism for controlling the optical axis of a light beam exiting from a semiconductor laser device.

2. Description of the related Art

There has been sought ever-smaller and ever-denser information equipment using an optical information recording medium, such as a CD-R drive, a CD-RW drive, and a DVD drive. In connection with an optical pickup apparatus which writes, reproduces, and erases information by means of gathering a light beam emitted from a semiconductor laser device onto an optical information recording medium, demand exists for miniaturization as well as for an improvement in the accuracy of gathering of light onto the optical information recording medium.

FIG. 69 shows a related-art semiconductor laser device described in, e.g., Japanese Patent Application Laid-Open No. 77604/1994. FIG. 70 is a cross-sectional view taken along line 70—70 shown in FIG. 69.

As shown in FIGS. 69 and 70, reference numeral 200 designates a semiconductor laser device; 202 designates a semiconductor laser element; 204 designates a silicon base; 206 designates a metal frame; 206a designates notched grooves for positioning purpose; 208 designates a resin-molded protective wall; 208a designates an upper portion of the protective wall; 208b designates a lower portion of the protective wall; 210 designates a die-bonding material; 212 designates an electrode lead; and 214 designates a wire lead.

FIG. 71 is a partial plan view of a related-art optical pickup apparatus equipped with a semiconductor laser device 200.

As shown in FIG. 71, reference numeral 220 designates an optical pickup apparatus; 222 designates an assembly having mounted thereon an optical component (not shown) constituting an optical system for gathering a light beam exiting from the semiconductor laser device 200 and directing the same onto an optical information recording medium; and 224 designates a support. The support 224 attaches the semiconductor laser device 200 to the assembly 222. Further, by means of the support 224 being fitted to the notched groove 206a formed in the metal frame 206 of the semiconductor laser device 200, the support 224 positions the semiconductor laser device 200 to the assembly 222.

Reference numeral 226 designates an adjusting screw for attaching the support 224 to the assembly 222. By means of regulating the extents to which the right-side and left-side adjusting screws 226 are fastened, the angle of an optical axis of the light beam exiting from the semiconductor laser device 200 is adjusted.

In relation to the optical pickup apparatus 220 having such a structure, when the semiconductor laser element 202 of the semiconductor laser device 200 is die-bonded, the semiconductor laser element 202 is die-bonded to the silicon base 204, and the silicon base 204 is die-bonded to the metal frame 206. Hence, a positional error stemming from bonding inevitably arises. As a result, a mismatch arises in an optical axis of the optical system of the assembly 222 and the optical axis of the light beam exiting from the semiconductor laser device 200.

In the event of occurrence of a mismatch between the optical axes, power becomes deficient when information is written onto the optical information recording medium. As a result, a characteristic of the optical pickup apparatus is deteriorated, and accurate writing operation is not performed, thus inducing an operation failure. In order to prevent occurrence of such an optical problem in the optical pickup apparatus 220, there is a necessity for realizing a match between the optical axes of the optical pickup apparatus 220 through adjustment.

In the related-art optical pickup apparatus 220, the support 224 is fitted to the notched groove 206a formed in the metal frame 206 of the semiconductor laser device 200, thereby positioning the semiconductor laser device 200 relative to the assembly 222. The support 224 is fixed to the assembly 222 with the adjusting screws 226. Since the position of the support 224 is defined with the adjusting screws 226, a horizontal deviation in the optical axis of the optical beam cannot be absorbed, which in turn induces occurrence of horizontal misalignment between the optical axis of the optical beam of the semiconductor laser element 202 and the optical axis of the optical system of the assembly 222.

Since a horizontal angular misalignment of the optical beam exiting from the semiconductor laser device 200 deteriorates jitter, required accuracy of the optical axis of the outgoing light is, for example, ±0.3 degrees. Jitter is impervious to vertical angular misalignment, and hence the vertical angular misalignment presents no substantial problem.

In order to satisfy such required accuracy, the related-art optical pickup apparatus 220 performs angular adjustment of the optical axis of the outgoing light by means of adjusting right-side and left-side adjusting screws 226 for fastening the supports 224 to the assembly 222. However, rotational adjustment performed by the adjusting screws 226 also results in parallel movement of a light-emitting point, thereby inducing a horizontal deviation. The adjustment mechanism using the adjusting screws 226 has a structure less apt to absorb a horizontal deviation, thus posing difficulty in performing sheer angular alignment.

FIG. 72 is a schematic view for describing movement of the light-emitting point through related-art angular adjustment of the optical axis.

As shown in FIG. 72, reference symbol C0 designates the direction of optical axis of the optical system of the assembly 222. At the outset, the optical axis of the light beam exiting from the light-emitting point of the semiconductor laser element 202 situated at point 0 is oriented in direction C. Provided that the optical axis is re-oriented toward direction C1 through rotational adjustment by means of the adjusting screws 226, the light-emitting point of the semiconductor laser element 202 often moves to point O1. Thus, difficult is encountered in minute angular adjustment without moving the position of the light-emitting point.

A related-art example mechanism described in, e.g. Japanese Patent Application Laid-Open No. 203403/1994, is not a mechanism for adjusting an angle of optical axis of a light beam, such as that performed by the previously-described optical pickup apparatus 220, to correct angular misalignment in the optical axis of outgoing light associated with a deviation in the semiconductor laser element 202 or an assembly failure, but a rotation angle adjustment mechanism for effecting tracking control.

FIG. 73 is a plan view of another related-art semiconductor laser device. FIG. 74 is a cross-sectional view of the semiconductor laser device taken along line 74—74 shown in FIG. 73.

As shown in FIGS. 73 and 74, those reference numerals which are identical with the reference numerals shown in FIGS. 69 and 70 designate identical or corresponding elements. Even in the following drawings, like reference numerals designate like or corresponding elements.

As shown in FIGS. 73 and 74, reference numeral 230 designates a semiconductor laser device; and 232 designates a mirror made of silicon which reflects the optical axis of the light exiting from the semiconductor laser element 202 to an orthogonal direction. Reference numeral 234 designates a hologram unit; 234a designates a grating pattern; and 234b designates a hologram pattern for the purpose of splitting a beam. The hologram unit 234 is omitted from FIG. 73.

FIG. 75 is a plan view showing a related-art mirror and semiconductor element. FIG. 76 is a cross-sectional view of the mirror and semiconductor laser element taken along line 76—76 shown in FIG. 75. "L" designates an optical axis of the light that has originated from the semiconductor laser element 202 and has been reflected at an angle of 90° by the mirror 232.

The rim of a protective wall upper portion 208a is formed into a circular-arch shape centered on the optical axis L of the light that has originated from the semiconductor laser element 202 and has been reflected by the mirror 232 in an orthogonal direction.

FIG. 77 is a partially-perspective plan view of the related-art optical pickup apparatus using the semiconductor laser device 230.

As shown in FIG. 77, the circular-arch rim of the protective wall upper portion 208a of the semiconductor laser device 230 is fitted to a circular-arch guide 236 formed in the assembly 222. The semiconductor laser device 230 is provided on the assembly 222 so as to be rotatable about the optical axis L of the light that has originated from the semiconductor laser element 202 and has been reflected by the mirror 232 to an orthogonal direction. After having been subjected to optical axis alignment, the semiconductor laser device 230 is secured on the assembly 222.

In order to effect tracking control in accordance with the three-beam method, the optical system semiconductor laser device 230 must rotate the light originated therefrom by way of the hologram unit 234 through a predetermined angle with respect to the direction of a track of an information recording medium. Therefore, the protective wall upper portion 208a of the optical system semiconductor laser device 230 is slid along the circular-arch guide 236 provided on the assembly 222 and rotated about the optical axis L, thus aligning the optical axis of the light.

SUMMARY OF THE INVENTION

The present invention has been made to overcome the above-described drawbacks and disadvantages of the related art. It is an object of the present invention to provide a semiconductor laser device which enables easy adjustment of angular misalignment in an optical axis of light exiting from a semiconductor laser.

According to one aspect of the invention, there is provided a semiconductor laser device comprising: a substrate having mutually-opposing first and second primary surfaces; a semiconductor laser element which is mounted on the first primary surface of the substrate and emits light having an optical axis along the primary surface: a wall member which is provided on the first primary surface of the substrate and surrounds the semiconductor laser element, except for the direction of the optical axis of the light originating from the semiconductor laser element; and a rotary-pair surface for rotating the optical axis of the light originating from the semiconductor laser element around a light-emitting point on an exit end face of the semiconductor laser element in a direction along the primary surface of the substrate, wherein the semiconductor laser device emits light having an optical axis along the primary surface of the substrate.

Accordingly, the present invention is advantageous for angular misalignment of the optical axis of light originating from the semiconductor laser element to be corrected readily by means of aligning a rotary-pair surface located on the semiconductor laser device with a counterpart rotary-pair surface.

It is another object of the present invention to provide an optical pickup apparatus which enables easy adjustment of angular misalignment in the optical axis of the outgoing light.

According to another aspect of the invention, there is provided an optical pickup apparatus comprises: a semiconductor laser device comprising, a substrate having mutually-opposing first and second primary surfaces, a semiconductor laser element which is mounted on the first primary surface of the substrate and emits light having an optical axis along the primary surface, a wall member which is provided on the first primary surface of the substrate and surrounds the semiconductor laser element except for the direction of the optical axis of the light originating from the semiconductor laser element, and a rotary-pair surface for rotating the optical axis of the light originating from the semiconductor laser element around a light-emitting point on an exit end face of the semiconductor laser element in a direction along the primary surface of the substrate, wherein the semiconductor laser device emits light having an optical axis along the primary surface of the substrate; and an assembly substrate having optical components of an optical system for collecting an optical beam originating from the semiconductor laser device onto an optical information recording medium, and a counterpart rotary-pair surface corresponding to the rotary-pair surface of the semiconductor laser device.

Accordingly, the present invention is advantageous for angular alignment of optical axis of an optical beam originating from the semiconductor laser device to be facilitated. Hence, the optical beam involving few angular misalignment with respect to the optical axis of an optical system provided on the assembly substrate can be converged onto an optical information recording medium. By extension, there can be constructed an optical pickup apparatus whose optical control is easy and which has a superior optical characteristic.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

A semiconductor laser device according to an embodiment of the invention comprises: a substrate having mutually-opposing first and second primary surfaces; a semiconductor laser element which is mounted on the first primary surface of the substrate and emits light having an optical axis along the primary surface, a wall member which is provided on the first primary surface of the substrate and surrounds the semiconductor laser element, except for the direction of the optical axis of the light originating from the semiconductor laser element; and a rotary-pair surface for rotating the optical axis of the light originating from the semiconductor laser element around a light-emitting point on an exit end face of the semiconductor laser element in a direction along the primary surface of the substrate, wherein the semiconductor laser device emits light having an optical axis along the primary surface of the substrate.

An optical pickup apparatus according to another embodiment of the invention comprises the semiconductor laser device, and an assembly substrate having optical components of an optical system for collecting an optical beam originating from the semiconductor laser device onto an optical information recording medium, and a counterpart rotary-pair surface corresponding to the rotary-pair surface located on the semiconductor laser device.

The optical pickup apparatus is used for writing, reproducing, and erasing data on and from a recording/reproduction apparatus using an optical information recording medium, such as a CD-R drive, a CD-RW drive, and a DVD drive.

First Embodiment

Figure 1:
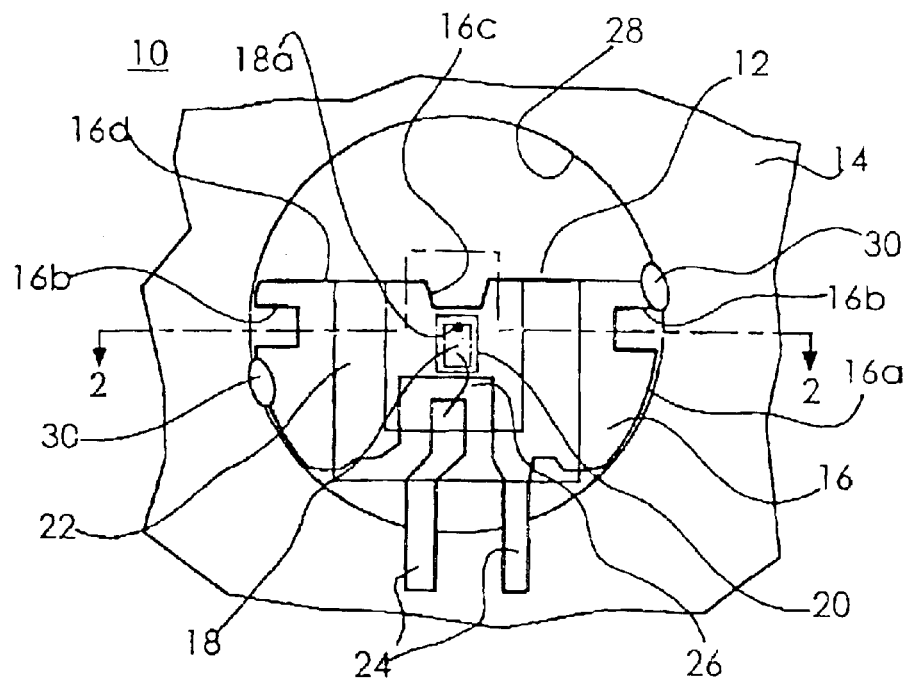
FIG. 1 is a partially-perspective plan view of an optical pickup device according to one embodiment of the invention.
Figure 2:
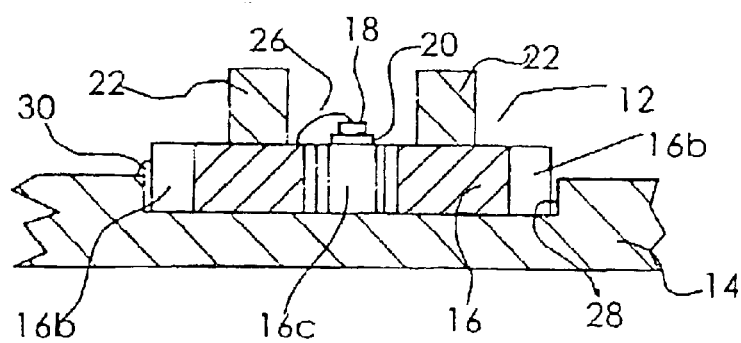
FIG. 2 is a cross-sectional view of the optical pickup device taken along line 2—2 shown in FIG. 1

FIG. 1 is a partially-perspective plan view of an optical pickup device according to a first embodiment of the invention. FIG. 2 is a cross-sectional view of the optical pickup device taken along line 2—2 shown in FIG. 1.

As shown in FIGS. 1 and 2, reference numeral 10 designates an optical pickup device; 12 designates a semiconductor laser device; and 14 designates an optical pickup base serving as an assembly substrate. The optical pickup base 14 is formed from, e.g., a magnesium alloy plate.

Reference numeral 16 designates a metal frame serving as a substrate of the semiconductor laser device 12. The metal frame is made by means of plating a copper nickel alloy with Au and assumes a thickness of about 0.1 to 0.5 mm. Reference numeral 18 designates a semiconductor laser element die-bonded to the surface of the metal frame 16 by means of an adhesive 20. Reference numeral 18a designates a light-emitting point located at an end face (hereinafter called an "outgoing end face") by way of which an optical beam is emitted from the semiconductor laser element 18.

The light-emitting point 18a located at the outgoing end face is a point for emitting a principal beam. Monitor light (not shown) exits from the rear end face of the semiconductor laser element 18. In some instances, emission of the semiconductor laser element may be controlled by means of a light-receiving element receiving light. Hereinbelow, outgoing light is described as a principal beam.

Portions of the rim of the metal frame 16 are formed so as to constitute portions of a circular arch centered on the point at which the light-emitting point 18a is set, on respective sides with reference to the light-emitting point 18a of the semiconductor laser element 18.

Circumference portions 16a form a sliding surface on one element of a rotary pair (hereinafter called a "rotary-pair surface"), whose rotary-pair surface is fitted to another sliding surface on a counterpart of the rotary pair (hereinafter called a "counterpart rotary-pair surface").

Reference numeral 16b designates U-shaped cavities serving as second notches into which a jig is inserted for rotating the semiconductor laser device 12 around the light-emitting point 18a. The U-shaped cavities 16b are omitted from FIGS. 30 through 33 and FIGS. 38 and 39, which show modifications of the first embodiment; from FIGS. 40 through 57 showing a second embodiment of the invention; and from FIGS. 61 through 68 showing modifications of a third embodiment of the invention. However, the pieces of optical pickup apparatus shown in those drawings have the U-shaped cavities 16b or corresponding features to be used for rotating the semiconductor laser device.

Reference numeral 16c designates a shading prevention groove. The shading prevention groove 16c is formed, in a thicknesswise direction of the metal frame 16, in a front edge 16d of the metal frame 16 in which the circumference portions 16a or the U-shaped cavities 16b are not formed. The semiconductor laser element 18 is die-bonded such that the outgoing end face of the semiconductor laser element 18 borders on the bottom of the shading prevention groove 16c. The shading prevention groove 16c has a width assuring that diffused light of a laser beam exiting from the light-emitting point 18a is not shaded by the front edge 16d of the metal frame 16.

Reference numeral 22 designates a protective wall, serving as a wall member, of the semiconductor laser element 18. The protective wall 22 surrounds the semiconductor laser element 18, except for the outgoing end face thereof. Reference numeral 24 designates electrode leads fastened by resin molding of the protective wall 22. Reference numeral 26 designates a lead wire for connecting the semiconductor laser element 18 to the electrode leads 24.

Mounted on the optical pickup base 14 are optical components (not shown) of the optical system for gathering the light beam exiting from the semiconductor laser device 12 on an optical information recording medium. A guide 28, which serves as a counterpart rotary-pair surface, is formed in the optical pickup base 14 so as to correspond to the respective circumference portions 16a, which serves as a rotary-pair surface. The center position of the guide 28 is selected so as to match the optical axis of the optical system mounted on the optical pickup base 14. The semiconductor laser device 12 is provided on the optical pickup base 14 via the circumference portions 16a fitted to the guide 28.

Reference numeral 30 designates an adhesive. After the optical axis of an optical beam exiting from the semiconductor laser device 12 has been aligned with the optical axis of the optical system mounted on the optical pickup base 14, the semiconductor laser device 12 and the optical pickup base 14 are bonded together by means of the adhesive 30.

A method of manufacturing the optical pickup device 10 will now be described briefly.

Figure 3:
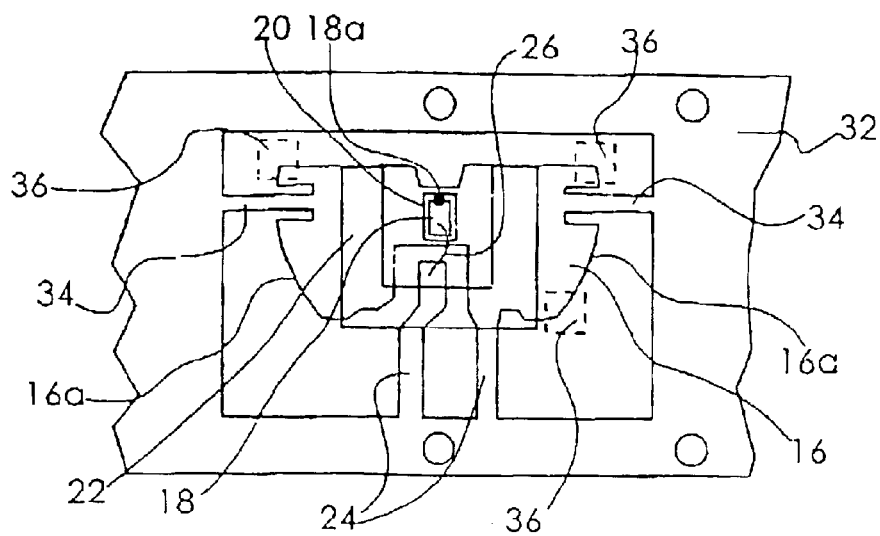
FIG. 3 is a partially-perspective plan view of a semiconductor laser device according to one embodiment of the invention, showing one of processes for manufacturing the semiconductor laser device.

FIG. 3 is a partially-perspective plan view of a semiconductor laser device, showing one of processes for manufacturing the semiconductor laser device according to the first embodiment of the invention.

As shown in FIG. 3, the metal frame 16 is formed while being connected to the lead frame 32 by means of suspension leads 34. The metal frame 16 is formed in the lead frame 32 through punching by use of metal molds. By means of this method, the metal frame 16 can be formed accurately. Alternatively the metal frame 16 may be formed through etching rather than punching.

The suspension leads 34 are connected to the metal frame 16 while the bottoms of the U-shaped cavities 16b of the metal frame 16 are taken as junctions. The electrode leads 24 are also formed in the lead frame 32.

Next, the protective wall 22 is formed through resin molding. At this time, the electrode leads 24 are fastened to the protective wall 22.

The semiconductor laser element 18 is then die-bonded to the metal frame 16.

Reference numeral 36 designates image recognition points for a die-bonder, which are enclosed by dotted line on the circumference portions 16a of the metal frame 16. The outer shape of the metal frame 16 can be formed accurately. Hence, when the outer shape is used as an image recognition point for the die-bonder, positional accuracy associated with mounting of the semiconductor laser element 18 is improved.

A point of center of the circular arch is determined from the three image recognition points 36 set on the circumference portions 16a. The semiconductor laser element 18 is die-bonded while the light-emitting point 18a provided at the outgoing end face of the semiconductor laser element 18 is superimposed on the center point. By means of such a method, the semiconductor laser element 18 can be die-bonded such that the light-emitting point 18a provided on the outgoing end face of the semiconductor laser element 18 is readily superimposed on the center point of the circumference portions 16a.

Figure 4:
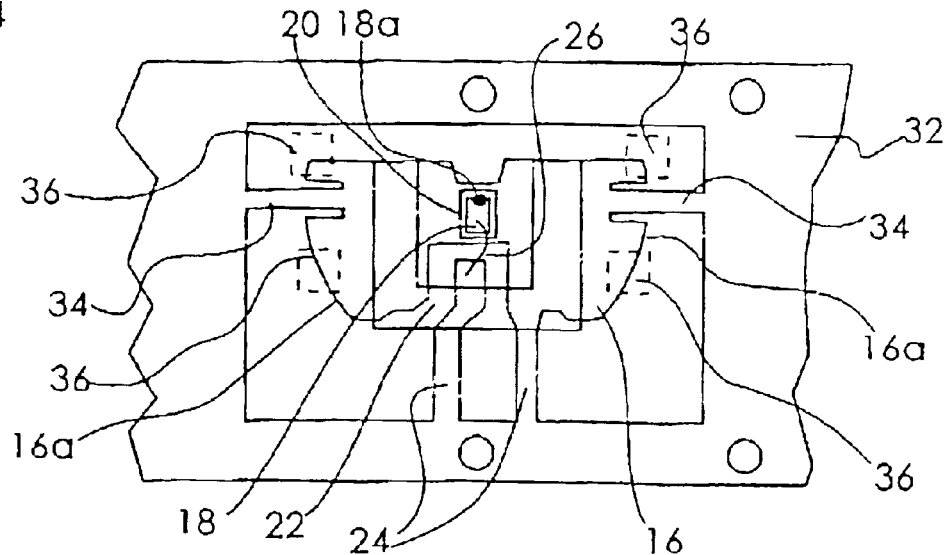
FIG. 4 is a partially-perspective plan view of a semiconductor laser device according to one embodiment of the invention, showing one of the processes for manufacturing a semiconductor laser device.

FIG. 4 is a partially-perspective plan view of a semiconductor laser device showing one of the processes for manufacturing a semiconductor laser device according to the first embodiment of the invention.

Although three image recognition points are shown in FIG. 3, three or more image recognition points may be employed, as shown in FIG. 4.

The electrode leads 24 are connected to the semiconductor laser element 18 by means of the lead wires 26. Subsequently, the suspension leads 34 and the electrode leads 24 are cut, thereby separating the semiconductor laser device 12 from the lead frame 32.

The circumference portions 16a of the semiconductor laser device 12 are fitted to the guide 28 of the optical pickup base 14. At this time, the image recognition points 36 shown in FIGS. 3 and 4 are used as reference points, whereby fitting operation is performed accurately.

The optical axis of the light beam exiting from the semiconductor laser device 12 is aligned with the optical axis of the optical system provided on the optical pickup base 14. This is done by means of rotating the semiconductor laser device 12 along the guide 28 of the optical pickup base 14, thereby correcting a rotation error stemming from die-bonding or assembly of the semiconductor laser element 18.

Figure 5:
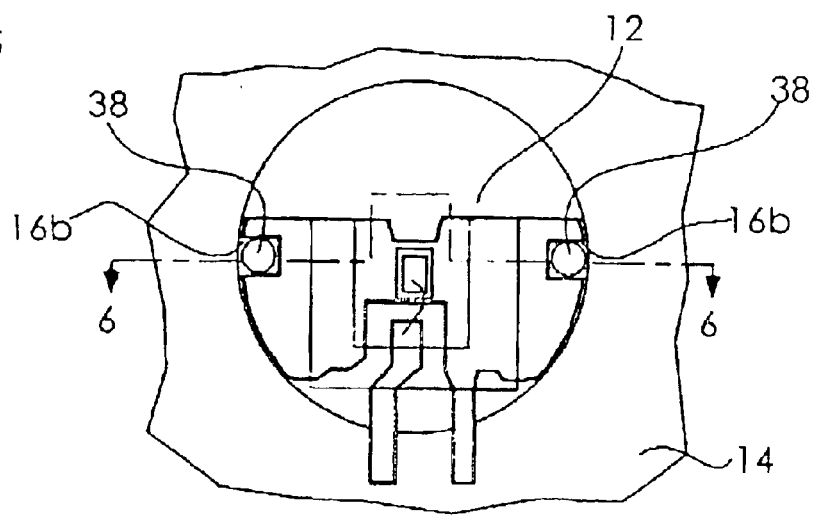
FIG. 5 is a schematic view showing a method of correcting a rotation error according to the invention.
Figure 6:
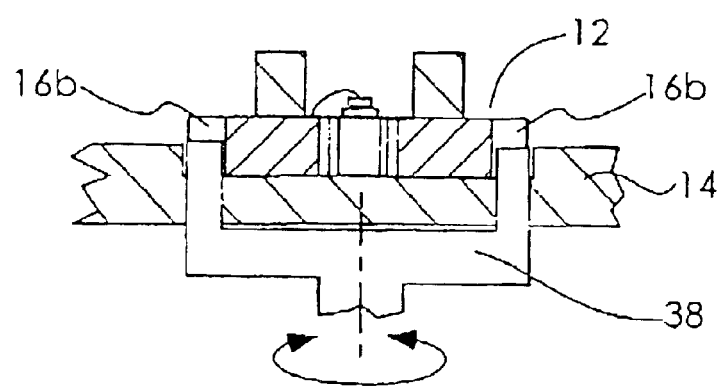
FIG. 6 is a cross-sectional view taken along line 6—6 shown in FIG. 5.
Figure 7:
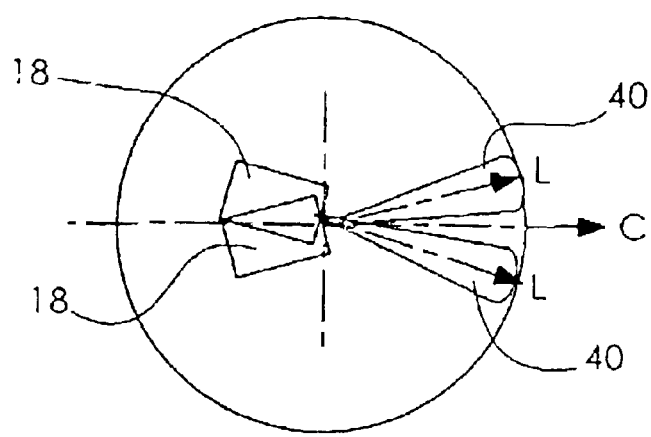
FIG. 7 is a schematic view for explaining that the position of the light-emitting point remains stationary when a rotation error is corrected under the method according to the invention.

FIG. 5 is a schematic view showing a method of correcting a rotation error according to the invention. FIG. 6 is a cross-sectional view taken along line 6—6 shown in FIG. 5. FIG. 7 is a schematic view for explaining that the position of the light-emitting point remains stationary when a rotation error is corrected under the method according to the invention.

As shown in FIGS. 5 and 6, reference numeral 38 designates a rotation adjustment jig. As shown in FIG. 7, reference numeral 40 designates a diffused laser beam. Reference symbol L designates an optical axis of outgoing light; and C designates the direction of optical axis of the optical system provided on the optical pickup base 14. Further, an arrowhead of the optical axis L denotes a direction in which the laser beam is to exit.

The rotation adjustment jig 38 is inserted into the U-shaped cavities 16b formed in the metal frame 16 of the semiconductor laser device 12 and effects micro-rotation adjustment, to thereby align the optical axis of the light beam exiting from the semiconductor laser device 12 with the optical axis of the optical system provided on the optical pickup base 14.

As shown in FIG. 7, the light-emitting point 18a of the semiconductor laser element 18 overlaps the center point of the circumference portions 16a of the metal frame 16 of the semiconductor laser device 12. The circumference portions 16a rotate along the guide 28 formed in the optical pickup base 14. At the time of adjustment of misalignment existing between the optical axis C of the optical system provided on the optical pickup base 14 and the optical axis L of the light beam exiting from the semiconductor laser element 18, the distance over which the light-emitting point 18a travels becomes shorter. Hence, angular misalignment between the optical axes is simplified.

The semiconductor laser device 12 is fastened to the optical pickup base 14 with the adhesive 30, thereby completing the optical pickup device 10.

Next will be described a configuration for preventing shading of the laser beam 40, which would otherwise be caused by the front edge 16d of the metal frame 16.

Figure 8:
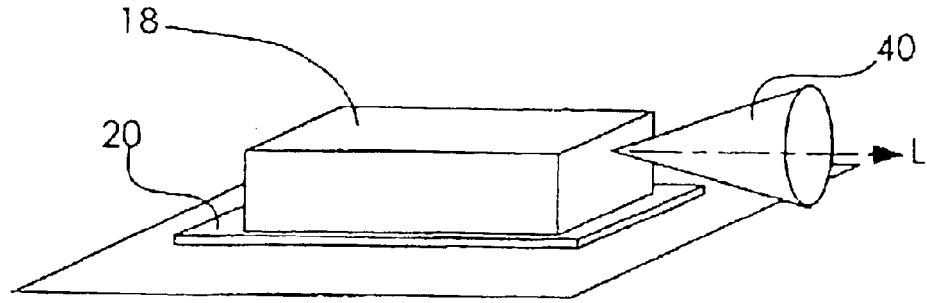
FIG. 8 is a schematic view showing how the light beam exiting from the semiconductor laser element is dispersed.

FIG. 8 is a schematic view showing how the light beam exiting from the semiconductor laser element is dispersed.

The light-emitting point 18a of the semiconductor laser element 18 is situated at the center of the circular arc constituted of the circumference portions 16a of the metal frame 16. Hence, if a substantial portion of the metal frame 16 is not provided on both side of the light-emitting point 18a and in positions forward and backward relative to the light-emitting point 18a, the circumference portions 16a cannot rotate in a constrained manner along the guide 28 formed in the optical pickup 14.

A substantial portion of the metal frame 16 tends to be located rearward relative to the light-emitting point 18a since the semiconductor laser element 18 is to be mounted on the metal frame 16. Moreover, there is a necessity of locating the substantial portion of the metal frame 16 forward of the semiconductor laser element 18, that is, forward of the light-emitting point 18a provided at the outgoing end face of the semiconductor laser element 18, by means of defining the front edge 16d ahead of the light-emitting point 18a.

As shown in FIG. 8, the laser beam exiting from the semiconductor laser element 18 is a beam having a vertically-oval cross-sectional profile. In some cases, there may arise a case where a portion of the luminous flux of the laser beam 40 is shaded by the front edge 16d of the metal frame 16. The shading prevention grooves 16c act as one of the mechanisms for preventing occurrence of such shading.

Figure 9:
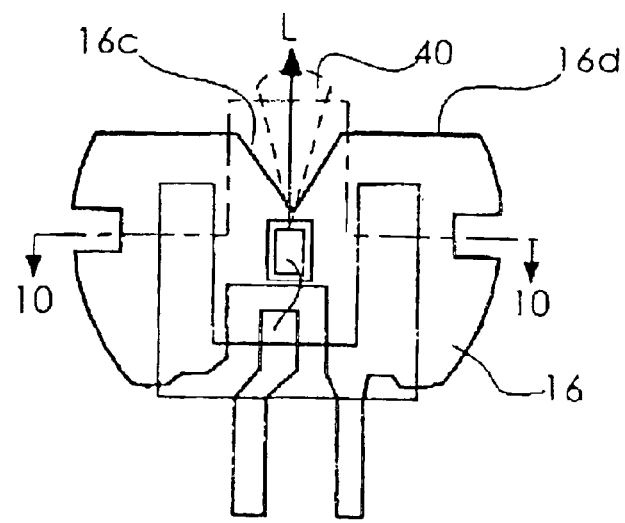
FIG. 9 is a plan view showing a semiconductor laser device according to one embodiment of the present invention, showing a modification of the shading prevention mechanism.
Figure 10:
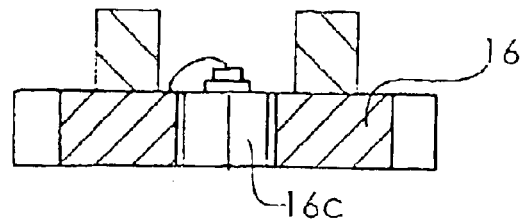
FIG. 10 is a cross-sectional view of the semiconductor laser device taken along line 10—10 shown in FIG. 9.

FIG. 9 is a plan view showing a semiconductor laser device according to the first embodiment, showing a modification of the shading prevention mechanism according to the embodiment. FIG. 10 is a cross-sectional view of the semiconductor laser device taken along line 10—10 shown in FIG. 9.

The shading prevention groove 16c shown in FIGS. 9 and 10 assumes the shape of the letter V when viewed from the top, as if cut from the front edge 16d of the metal frame 16. The shading prevention mechanism 16c is formed such that the angle of the V-shaped opening becomes greater than a diffusion angle.

Figure 11:
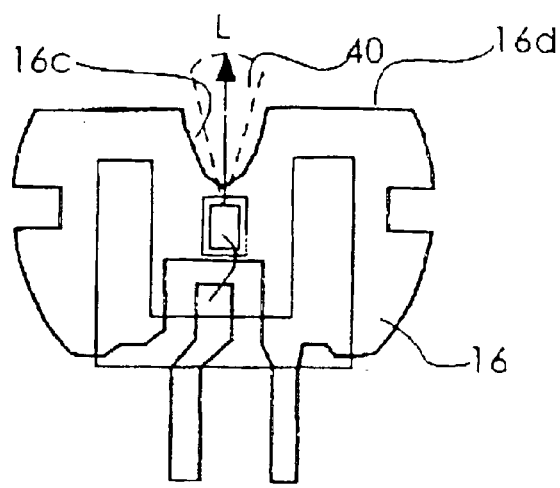
FIGS. 11 and 12 are plan views showing a semiconductor laser device according to one embodiment of the present invention, showing other modifications of the shading prevention mechanism.
Figure 12:
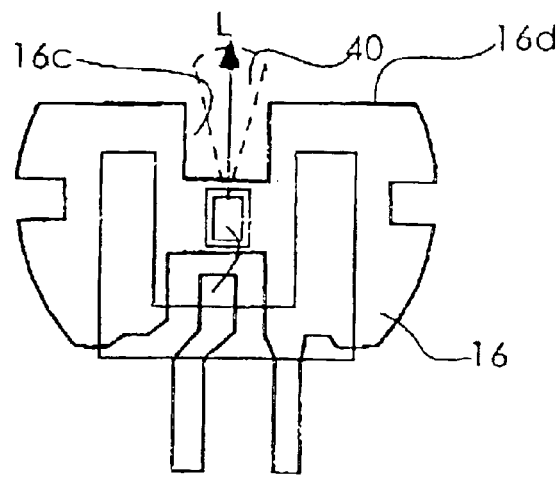

FIGS. 11 and 12 are plan views showing a semiconductor laser device according to the present embodiment, showing other modifications of the shading prevention mechanism.

The shading prevention groove 16c shown in FIG. 11 assumes the shape of letter the U when viewed from top, as if cut from the front edge 16d of the metal frame 16. The U-shaped opening is formed so as to become wider than the diffusion width of the laser beam 40.

The shading prevention groove 16c shown in FIG. 12 assumes the shape of a rectangular indentation when viewed from the top, as if recessed from the front edge 16d of the metal frame 16. The recessed opening is formed so as to become wider than the width of diffusion of the laser beam 40.

Figure 13:
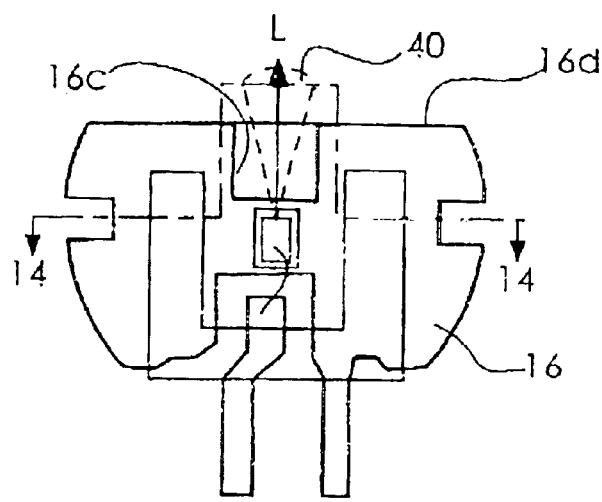
FIG. 13 is a plan view of the semiconductor laser device according to one embodiment of the present invention, showing another modification of the shading prevention mechanism.
Figure 14:
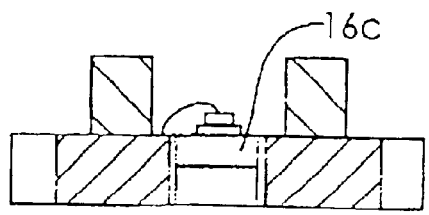
FIG. 14 is a cross-sectional view of the semiconductor laser device taken along line 14—14 shown in FIG. 13.

FIG. 13 is a plan view of the semiconductor laser device according to the present embodiment, showing another modification of the shading prevention mechanism. FIG. 14 is a cross-sectional view of the semiconductor laser device taken along line 14—14 shown in FIG. 13.

The shading prevention groove 16c shown in FIGS. 13 and 14 assumes the shape of a rectangular recess when viewed from top, as if recessed from the front edge 16d to a certain level in the thicknesswise direction of the metal frame 16.

The recessed opening is formed deeper and wider than the width and depth of diffusion of the laser beam 40.

Figure 15:
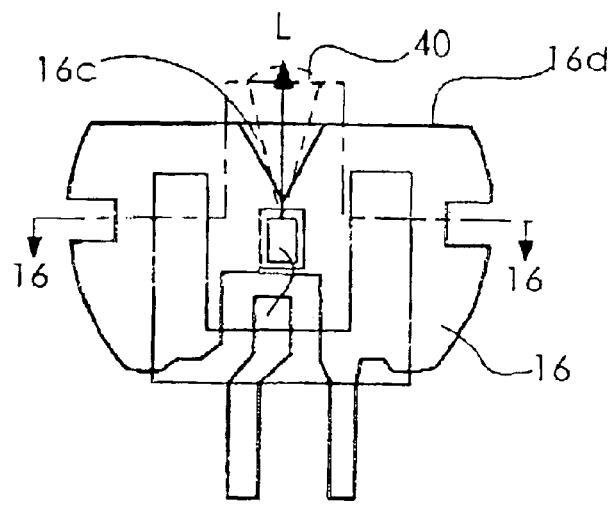
FIG. 15 is a plan view of the semiconductor laser device according to one embodiment of the present invention, showing another modification of the shading prevention mechanism.
Figure 16:
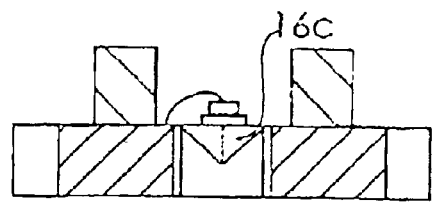
FIG. 16 is a cross-sectional view of the semiconductor laser device taken along line 16—16 shown in FIG. 15.

FIG. 15 is a plan view of the semiconductor laser device according to the present embodiment, showing another modification of the shading prevention mechanism. FIG. 16 is a cross-sectional view of the semiconductor laser device taken along line 16—16 shown in FIG. 15.

The shading prevention groove 16c shown in FIGS. 15 and 16 assumes the shape of the letter V, as if recessed from the front edge 16d to a certain level in the thicknesswise direction of the metal frame 16. The V-shaped opening is formed deeper and wider than the width and depth of diffusion of the laser beam 40.

Figure 17:
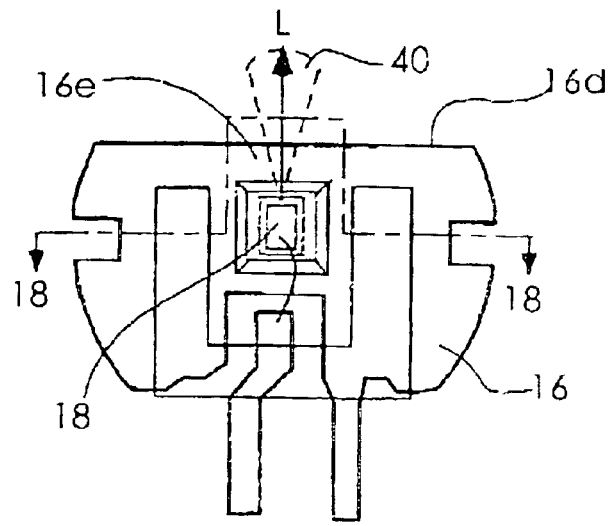
FIG. 17 is a plan view of a semiconductor laser device according to one embodiment of the present invention, showing another modification of the shading prevention mechanism.
Figure 18:
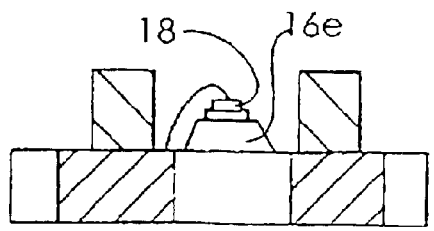
FIG. 18 is a cross-sectional view taken along line 18—18 shown in FIG. 17.

FIG. 17 is a plan view of a semiconductor laser device according to the embodiment, showing another modification of the shading prevention mechanism. FIG. 18 is a cross-sectional view taken along line 18—18 shown in FIG. 17.

The shading prevention mechanism shown in FIGS. 17 and 18 does not have the shape of a groove; the shading preventing mechanism has a shading prevention projection 16e, thus assuming the shape of a truncated pyramid. The semiconductor laser element 18 is die-bonded to a top plane along a ridge line of the top of the shading prevention projection 16e.

Figure 19:
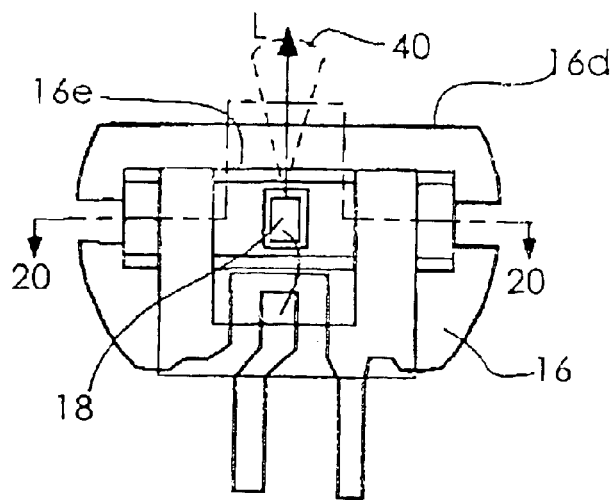
FIG. 19 is a plan view of the semiconductor laser device according to one embodiment of the present invention, showing another modification of the shading prevention mechanism.
Figure 20:
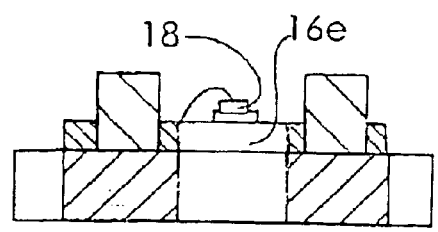
FIG. 20 is a cross-sectional view taken along line 20—20 shown in FIG. 19.

FIG. 19 is a plan view of the semiconductor laser device according to the embodiment, showing another modification of the shading prevention mechanism. FIG. 20 is a cross-sectional view taken along line 20—20 shown in FIG. 19.

The light shading prevention projection 16e shown in FIGS. 19 and 20 assumes a trapezoidal shape spreading along the front edge 16d of the metal frame 16. The semiconductor laser element 18 is die-bonded to a top plane along a ridge line of the top of the shading prevention projection 16e.

Figure 21:
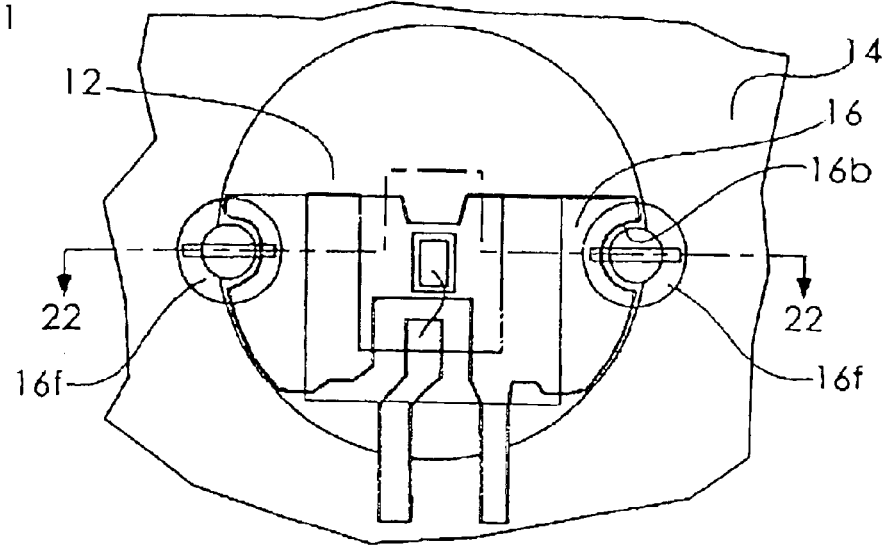
FIG. 21 is a partially-perspective plan view of an optical pickup apparatus according to one embodiment of the present invention, showing another modification of the method of fastening the semiconductor laser device.
Figure 22:
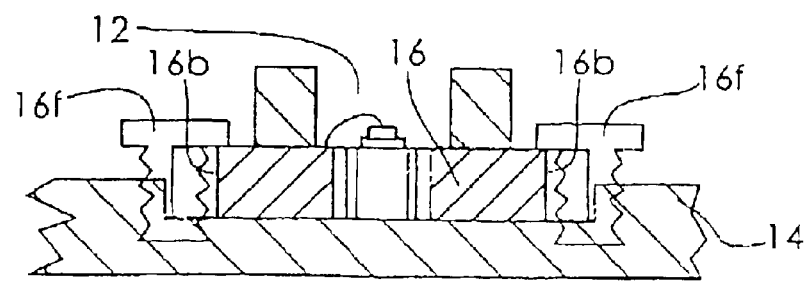
FIG. 22 is a cross-sectional view taken along line 22—22 shown in FIG. 21.

FIG. 21 is a partially-perspective plan view of an optical pickup apparatus according to the embodiment, showing another modification of the method of fastening the semiconductor laser device. FIG. 22 is a cross-sectional view taken along line 22—22 shown in FIG. 21.

As shown in FIG. 1, the semiconductor laser device 12 and the optical pickup base 14 are bonded together by means of an adhesive. In contrast, as shown in FIGS. 21 and 22, the semiconductor laser device 12 and the optical pickup base 14 are fastened together by means of utilization of U-shaped holes 16b formed in the metal frame 16 of the semiconductor laser device 12, in combination with use of anchor screws 16f.

Next will be described a modification of the rotary-pair surface provided on the semiconductor laser device 12 and those provided on the optical pickup base 14 within the optical pickup apparatus 10.

Figure 23:
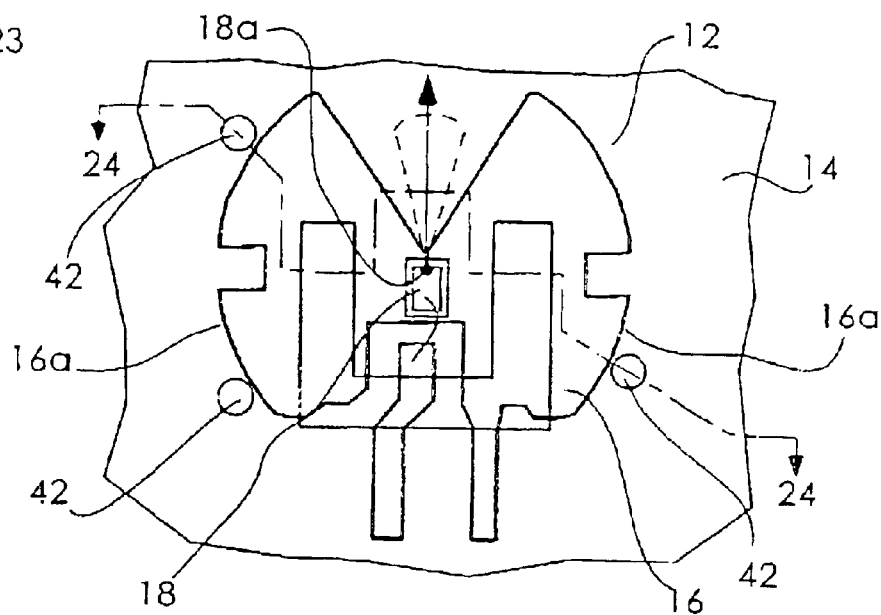
FIG. 23 is a partially-perspective plan view of an optical pickup apparatus according to one embodiment of the present invention, showing another modification of the optical pickup apparatus.
Figure 24:
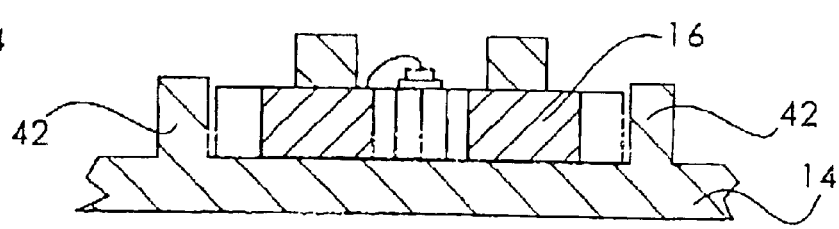
FIG. 24 is a cross-sectional view of the optical pickup apparatus taken along line 24—24 shown in FIG. 23.

FIG. 23 is a partially-perspective plan view of an optical pickup apparatus, showing another modification of the optical pickup apparatus according to the embodiment. FIGS. 24 is a cross-sectional view of the optical pickup apparatus taken along line 24—24 shown in FIG. 23.

In relation to the rotary pair shown in FIG. 23, the circumferential portions 16a of the metal frame 16, as a rotary-pair surface, are formed from a circular arc centered on the position where the light-emitting point 18a of the semiconductor laser element 18 is situated. Further, a counterpart rotary-pair surfaces formed on the optical pickup base 14 is constituted of three cylindrical pins 42. Side surfaces of the respective cylindrical pins 42 are tangent to a circumference centered on a point coinciding with the optical axis of an optical system of the optical pickup base 14. Here, the number of cylindrical pins 42 is not necessarily limited to three.

FIGS. 25 through 29 are partially-perspective plan views of the optical pickup apparatus according to the embodiment, showing modifications of the rotary pair of the optical pickup apparatus.

Figure 25:
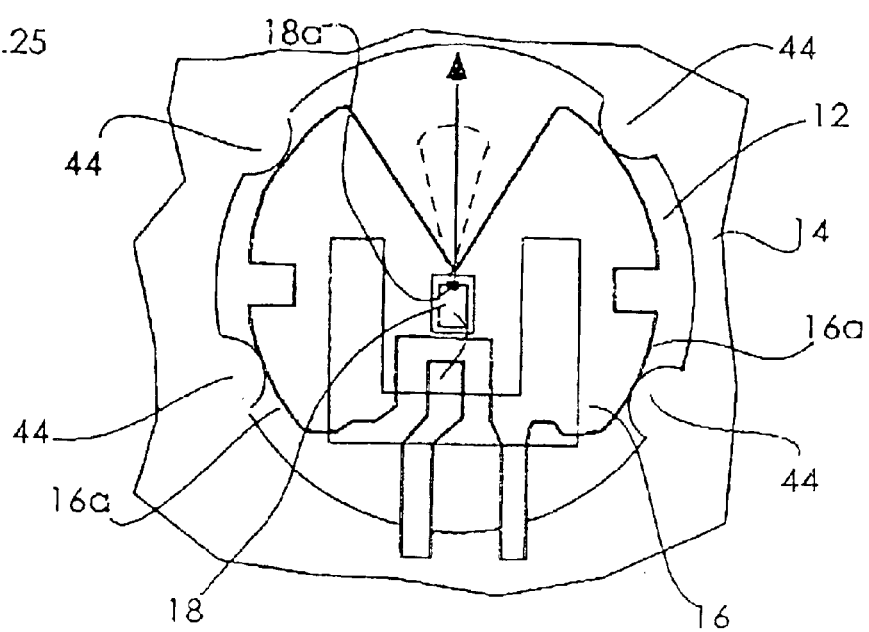
FIGS. 25 through 29 are partially-perspective plan views of the optical pickup apparatus according to one embodiment of the present invention, showing modifications of the rotary pair of the optical pickup apparatus.

The rotary-pair surface shown in FIG. 25 is constituted of the circumferential portions 16a formed on the metal frame 16, as in the case of the modification shown in FIG. 23. The counterpart rotary-pair surface formed on the optical pickup base 14 is constituted of four circular-arc cylindrical projections 44. Side surfaces of the respective cylindrical projections 44 are tangent to a circumference centered on a point coinciding with the optical axis of an optical system of the optical pickup base 14. Here, the number of cylindrical projections 44 is not necessarily limited to four.

Figure 26:
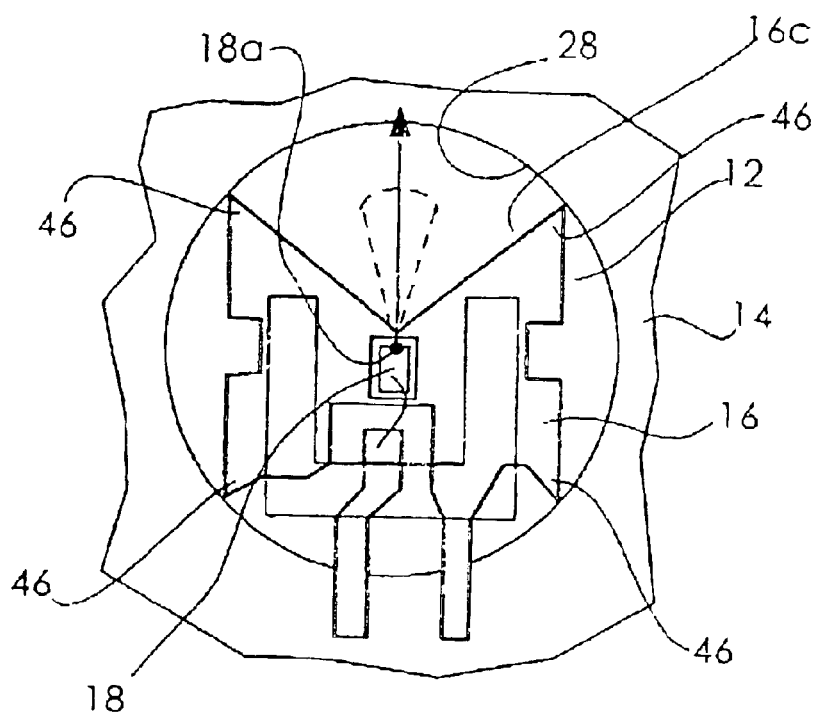

In relation to rotary pair shown in FIG. 26, a rotary-pair surface formed on the optical pickup base 14 is embodied by a circular-arc guide 28 centered on a point coinciding with the optical axis of the optical system of the optical pickup base 14. A counter part rotary-pair surface formed on the metal frame 16 is constituted of four pointed portions 46. The pointed portions 46 are formed on the circumference centered on the position where the light-emitting point 18a of the semiconductor laser element 18 is set.

Figure 27:
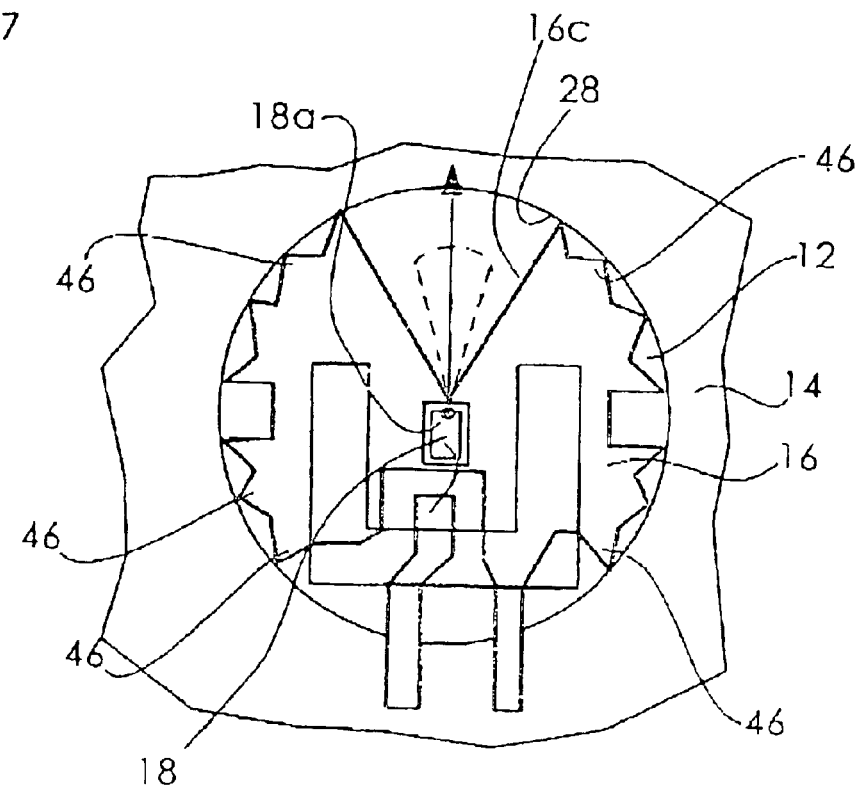

FIG. 27 shows an example in which a much larger number of pointed portions 46 constituting the counterpart rotary-pair surface are formed on the metal frame 16.

Figure 28:
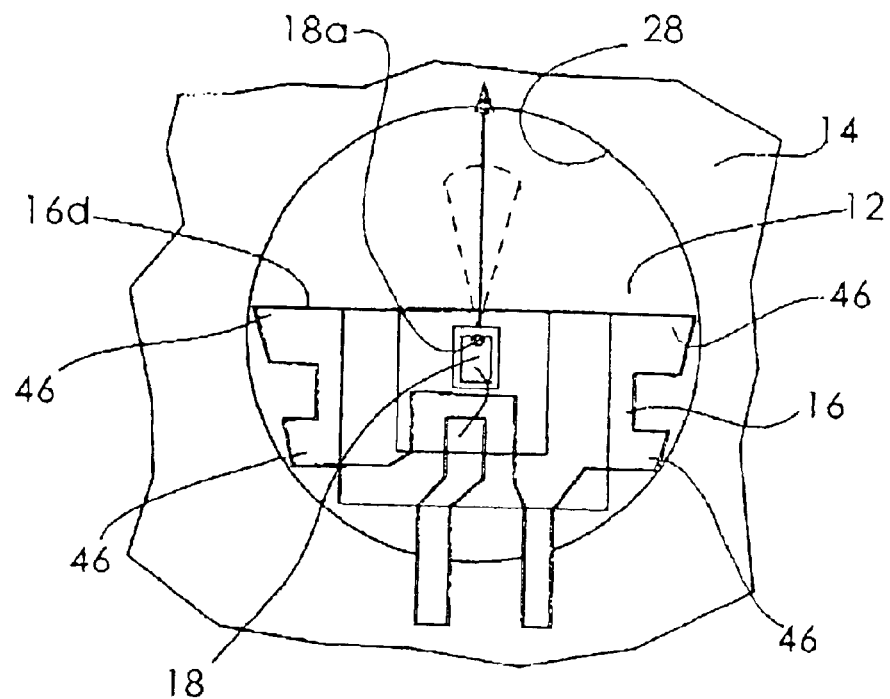

FIG. 28 is an example close to the modification shown in FIG. 26. The metal frame 16 shown in FIG. 26 has the shading prevention groove 16c which is recessed into the shape of the letter V when viewed from top. The modification shown in FIG. 28 is identical with that shown in FIG. 26 in that the rotary-pair surf ace on the metal frame 16 is constituted of the four pointed portions 46 of the metal frame 16 formed on the circumference centered on the position where the light-emitting point 18a of the semiconductor laser element 18 is disposed. The front edge 16d of the metal frame 16 is located in proximity to the position where the light-emitting point 18a is situated, thereby obviating the shading prevention groove 16c. The front edge 16d is taken as a chord in parallel with a radius passing through the light-emitting point 18a. The number of metal frames 16 to be formed from the lead frame 32 can be increased, by means of reducing the width of the metal frame 16 in the direction of the optical axis. Hence, the semiconductor laser device 10 can be constructed inexpensively.

Figure 29:
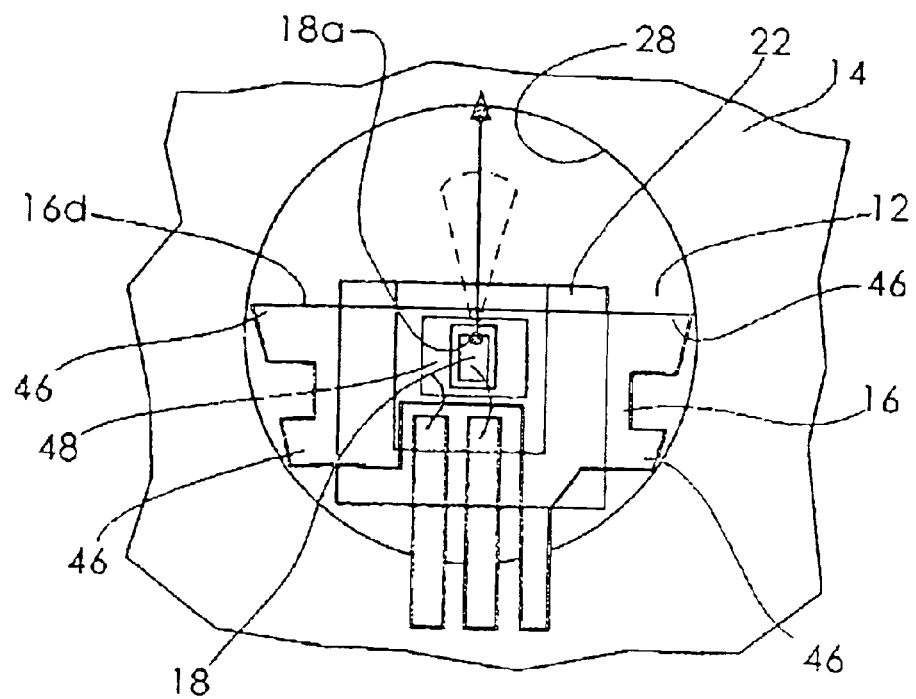

A modification shown in FIG. 29 is identical with that shown in FIG. 28 in that the front edge 16d of the metal frame 16 is made close to the position where the light-emitting point 18a is situated, thereby obviating the light shading prevention groove 16c, and in that the front edge 16d is taken as a chord disposed in parallel with the line of radius passing through the light-emitting point 18a. The protective wall 22 is caused to protrude beyond the front edge 16d. A pedestal 48, which is formed from silicon and doubles as a light-receiving element for receiving monitor light emitted from the semiconductor laser element 18, is provided on the metal frame 16. The semiconductor laser element 18 is die-bonded on the pedestal 48.

By means of such a construction, so long as the pedestal 48 made of silicon is formed from an insulator; e.g., aluminum nitride (AlN), the surface of the pedestal 48 on which a chip is to be mounted can be electrically isolated from the metal frame 16. As a result, the cathode of the semiconductor laser element 18 can be separated from a ground terminal, thereby improving frequency response.

The above descriptions are directed to the construction in which the rotary-pair surface is provided on the outer circumference of the metal frame 16. However, the following modifications are directed to a construction in which a recess or protuberance is formed in or on the lower surface of the metal frame 16 and in which a rotary-pair surface is provided on a side surface of the recess or protuberance.

Figure 30:
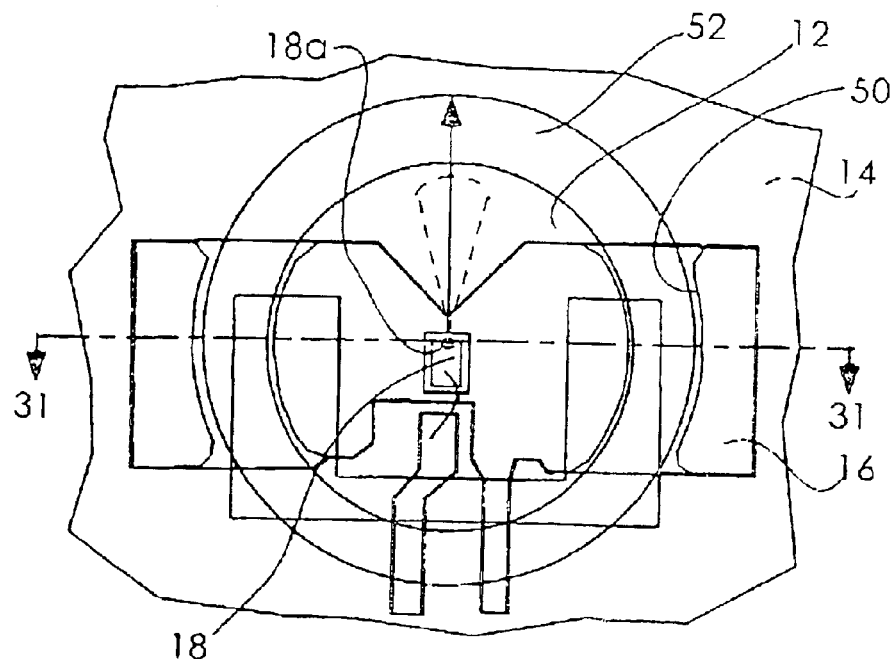
FIG. 30 is a partially-perspective plan view of the optical pickup apparatus according to one embodiment of the present invention, showing another modification of rotary-pair surfaces.
Figure 31:
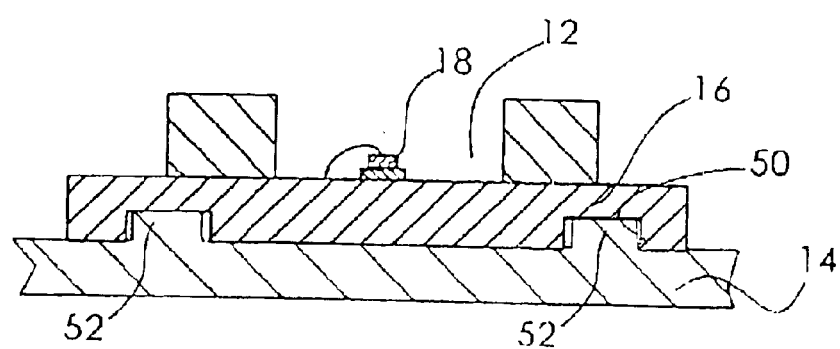
FIG. 31 is a cross-sectional view of the optical pick-up apparatus taken along line 31—31 shown in FIG. 30.

FIG. 30 is a partially-perspective plan view of the optical pickup apparatus according to the embodiment, showing another modification of rotary-pair surfaces. FIG. 31 is a cross-sectional view of the optical pick-up apparatus taken along line 31—31 shown in FIG. 30.

As shown in FIGS. 30 and 31, reference numeral 50 designates an annular groove formed in the lower surface of the metal frame 16, and 52 designates an annular projection provided on the surface of the optical pickup base 14.

A side surface of the annular groove 50 is formed from a cylindrical surface centered on the position where the light-emitting point 18a of the semiconductor laser element 18 is situated. A side surface of the annular projection 52 is formed from a cylindrical surface centered on a point coinciding with the optical axis of the optical system of the optical pickup base 14. The side surface of the annular groove 50 and the side surface of the annular projection 52 serve as a rotary-pair surface and a counterpart rotary-pair surface respectively, thus constituting a rotary pair. The annular groove 50 and the annular projection 52 are formed when the metal frame 16 and the optical pickup base 14 are punched. However, the annular groove 50 and the annular projection 52 may be formed through etching or cutting.

Figure 32:
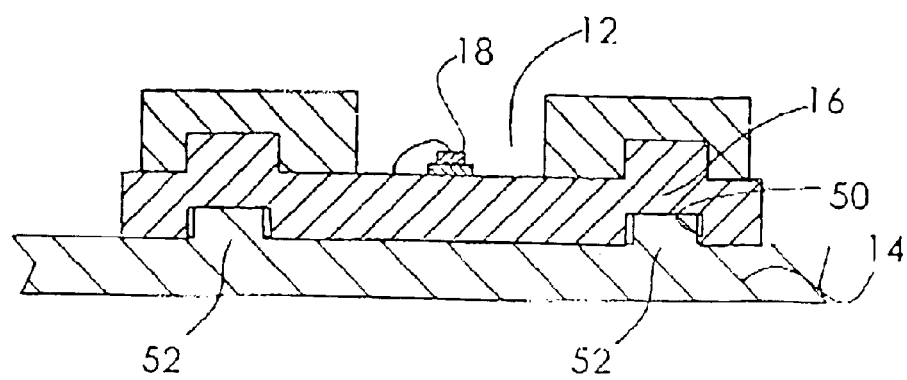
FIGS. 32 and 33 are cross-sectional views of the optical pickup apparatus according to one embodiment of the present invention, showing another modification of the rotary-pair of the optical pickup apparatus.
Figure 33:
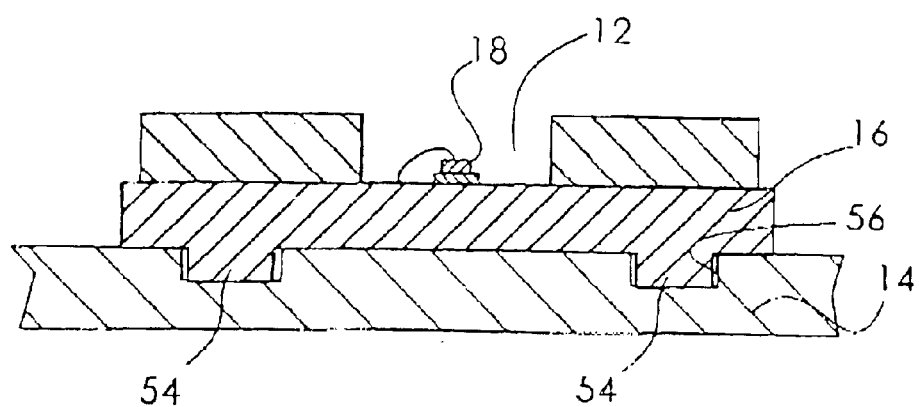

FIGS. 32 and 33 are cross-sectional views of the optical pickup apparatus according to the embodiment, showing another modification of the rotary-pair of the optical pickup apparatus.

The annular groove 50 of the metal frame 16 used in the semiconductor laser device 12 shown in FIG. 32 is identical in shape with the rotary-pair surface of the annular groove 50 shown in FIG. 31. However, the annular groove 50 is formed through punching, so that a projection stemming from punching is formed on the upper surface of the metal frame 16. The optical pickup apparatus shown in FIG. 32 is identical in plane geometry with that shown in FIG. 30.

As shown in FIG. 33, reference numeral 54 designates an annular protuberance formed on the lower surface of the metal frame 16, and 56 designates an annular groove formed on the surface of the optical pickup base 14.

The optical pickup apparatus shown in FIG. 33 is embodied by means of interchanging the annular protuberance and the annular groove of the optical pickup apparatus shown in FIGS. 30 and 31.

Figure 34:
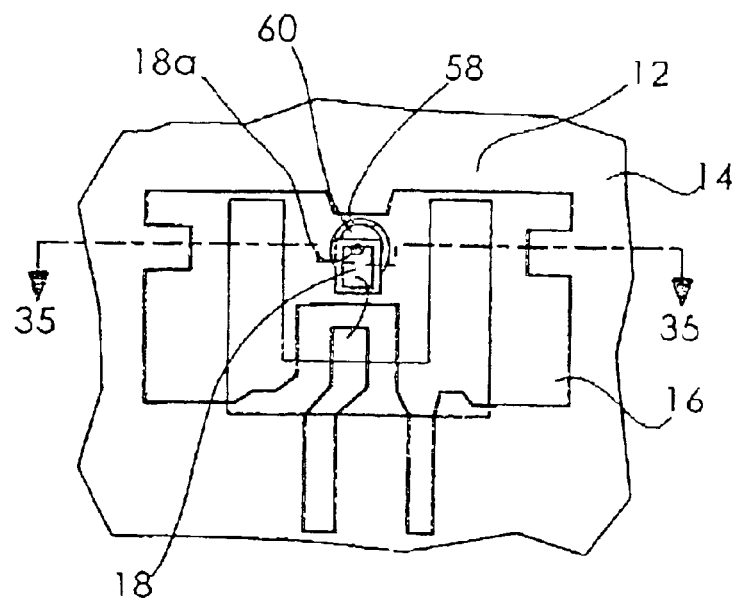
FIG. 34 is a partially-perspective plan view of the optical pickup apparatus according to one embodiment of the present invention, showing another modification of rotary-pair surfaces of the optical pickup apparatus.
Figure 35:
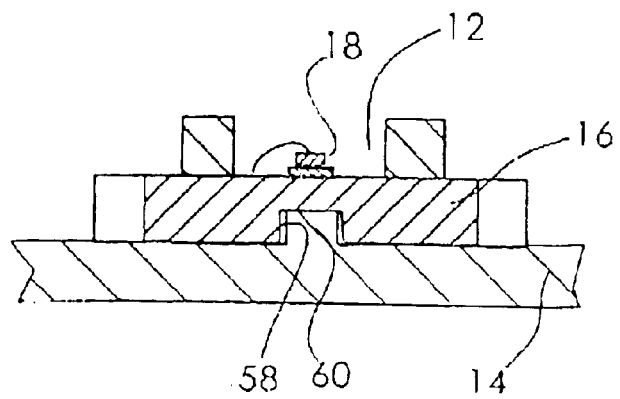
FIG. 35 is a cross-sectional view of the optical pick-up apparatus taken along line 35—35 shown in FIG. 34.

FIG. 34 is a partially-perspective plan view of the optical pickup apparatus according to the embodiment showing another modification of rotary-pair surfaces of the optical pickup apparatus. FIG. 35 is a cross-sectional view of the optical pick-up apparatus taken along line 35—35 shown in FIG. 34.

As shown in FIGS. 34 and 35, reference numeral 58 designates a cylindrical hole formed in the lower surface of the metal frame 16, and 60 designates a cylindrical projection provided on the surface of the optical pickup base 14.

The cylindrical hole 58 is centered on the position where the light-emitting point 18a of the semiconductor laser element 18 is set. The cylindrical projection 60 is centered on a point coinciding with the optical axis of the optical system of the optical pickup base 14. The side surface of the cylindrical hole 58 and the side surface of the cylindrical projection 60 are taken as a rotary pair surface and a counterpart rotary-pair surface respectively, thus constituting a rotary pair.

Figure 36:
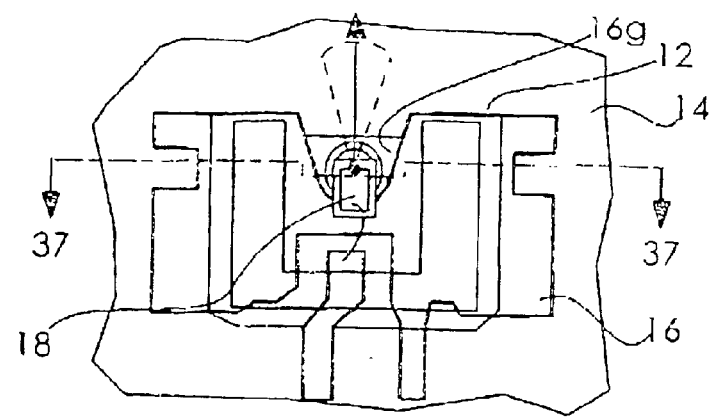
FIG. 36 is a partially-perspective plan view of the optical pickup apparatus according to one embodiment of the present invention, showing another modification of a rotary pair of the optical pickup apparatus.
Figure 37:
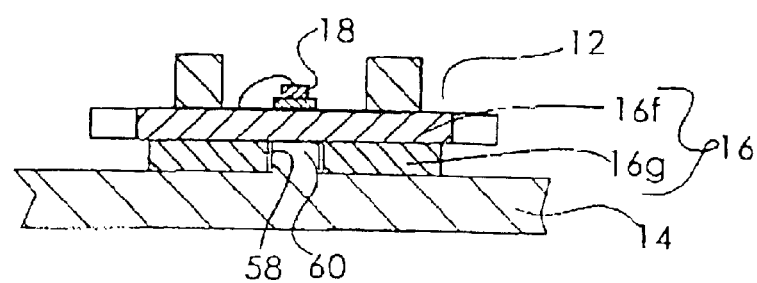
FIG. 37 is a cross-sectional view of the optical pick-up apparatus taken along line 37—37 shown in FIG. 36.

FIG. 36 is a partially-perspective plan view of the optical pickup apparatus according to the embodiment, showing another modification of a rotary pair of the optical pickup apparatus. FIG. 37 is a cross-sectional view of the optical pick-up apparatus taken along line 37—37 shown in FIG. 36.

As shown in FIGS. 36 and 37, reference numeral 16f designates an upper metal frame; and 16g designates a lower metal frame. The upper metal frame 16f and the lower metal frame 16g are cemented together through, e.g., welding. A rotary-pair surface and a counterpart rotary-pair surface constituting a rotary pair are identical in construction with those of the modification shown in FIGS. 34 and 35.

Figure 38:
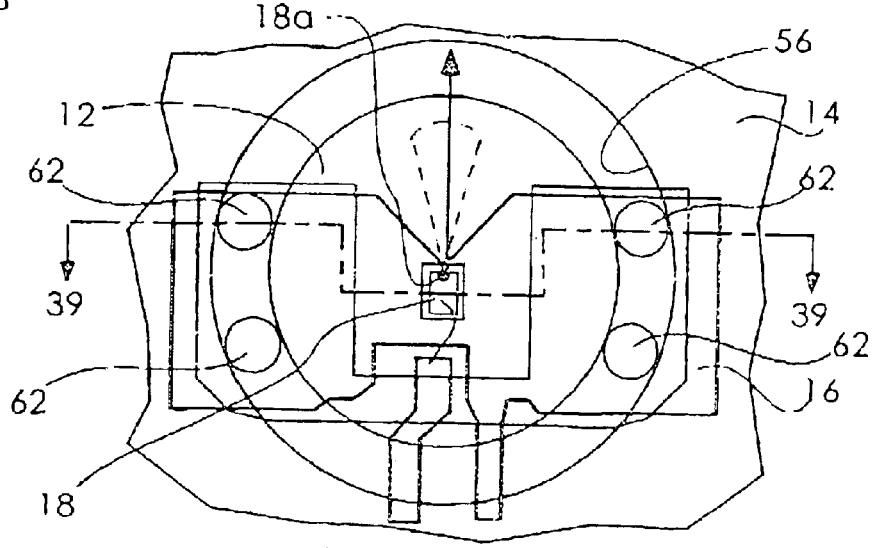
FIG. 38 is a partially-perspective plan view of the optical pickup apparatus according to one embodiment of the present invention, showing another modification of a rotary pair of the optical pickup apparatus.
Figure 39:
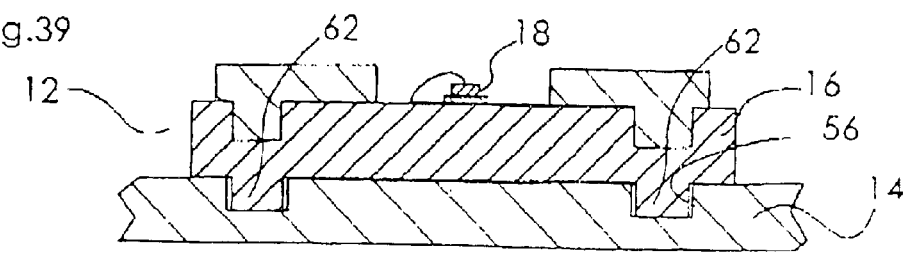
FIG. 39 is a cross-sectional view of the optical pick-up apparatus taken along line 39—39 shown in FIG. 38.

FIG. 38 is a partially-perspective plan view of the optical pickup apparatus according to the embodiment, showing another modification of a rotary pair of the optical pickup apparatus. FIG. 39 is a cross-sectional view of the optical pick-up apparatus taken along line 39—39 shown in FIG. 38.

As shown in FIGS. 38 and 39, reference numeral 62 designates a cylindrical projection provided on the lower surface of the metal frame 16. The annular groove 56 having the cylindrical projections 62 fitted therein is formed in the surface of the optical pickup base 14.

The respective centers of the four cylindrical projections 62 provided on the lower surface of the metal frame 16 are set on the circle centered on the position where the light-emitting point 18a of the semiconductor laser element 18 is situated. Accordingly, two common cylindrical contact surfaces remain contact in with the side surfaces of the four cylindrical projections 62. The side surfaces of the cylindrical projections 62 that remain in contact with the common cylindrical contact surfaces are taken as a rotary-pair surface. The side surface of the annular groove 56 is also taken as a counterpart rotary-pair surfac and remains in fitting contact with the cylindrical projections 62. The cylindrical projections 62 can be formed through punching. Although this example has employed four cylindrical projections 62, the number of projections is not limited to four.

In the optical pickup apparatus 10 according to the first embodiment, a rotary-pair surface is formed on the metal frame 16 of the semiconductor laser device 12. The light-emitting point 18a of the semiconductor laser element 18 is selectively set on the rotation center of the rotary-pair surfaces and the semiconductor laser element 18 is die-bonded. The optical pickup base 14 has a counterpart rotary-pair surface whose center point is selectively aligned with the optical axis of the optical system mounted on the optical pickup base 14. The semiconductor laser device 12 and the optical pickup base 14 are cemented together via the respective rotary-pair surfaces. Hence, the optical pickup apparatus 10 according to the first embodiment enables easy alignment for correcting angular misalignment between the optical axis of the optical system mounted on the optical pickup base 14 and the optical axis of the laser beam originating from the semiconductor laser device 12.

Since the metal frame 16 of the semiconductor laser device 12 ran be formed to greater accuracy through punching, the rotary-pair surface of the metal frame 16 can also be formed to greater accuracy. Therefore, there is reduced a deviation between the light-emitting point 18a of the semiconductor laser element 18 and the center point of the circular arc defining the guide 28 of the optical pickup base 14. Hence, there can be diminished angular misalignment or parallel deviation existing between the optical axis of the laser beam originating from the light-emitting point 18a of the semiconductor laser element 18 and the optical axis of the optical system mounted on the optical pickup base 14.

The bottom surface of the metal frame 16 remains in direct contact with the surface of the optical pickup base 14, thereby achieving a superior radiation characteristic, enabling stable maintaining of an optical output characteristic of the semi conductor laser device 12, and prolonging the life of the semiconductor laser device 12. By extension, a highly reliable optical pickup apparatus can be provided.

When the circumferential portions 16a of the metal frame 16 are provided on the outer periphery of the metal frame 16 of the semiconductor laser device 12, the circumferential portions 16a of the metal frame 16 can be made by means of primary machining. Hence, the circumferential portions 16a can be formed to greater accuracy. Hence, the semiconductor laser element 18 can be die-bonded onto the metal frame 16 with high positional accuracy by means of using the outer periphery as an image recognition point for a die-bonder. Accordingly, a positional deviation between the light-emitting point 18a of the semiconductor laser element 18 and the center point of the circular arc of the guide 28 of the optical pickup base 14 becomes much smaller. Hence, there can be diminished angular misalignment or parallel deviation existing between the optical axis of the laser beam originating from the light-emitting point 18a of the semiconductor laser element 18 and the optical axis of the optical system mounted on the optical pickup base 14. By extension, a highly-reliable optical pickup apparatus having a superior optical characteristic can be provided.

Second Embodiment

Figure 40:
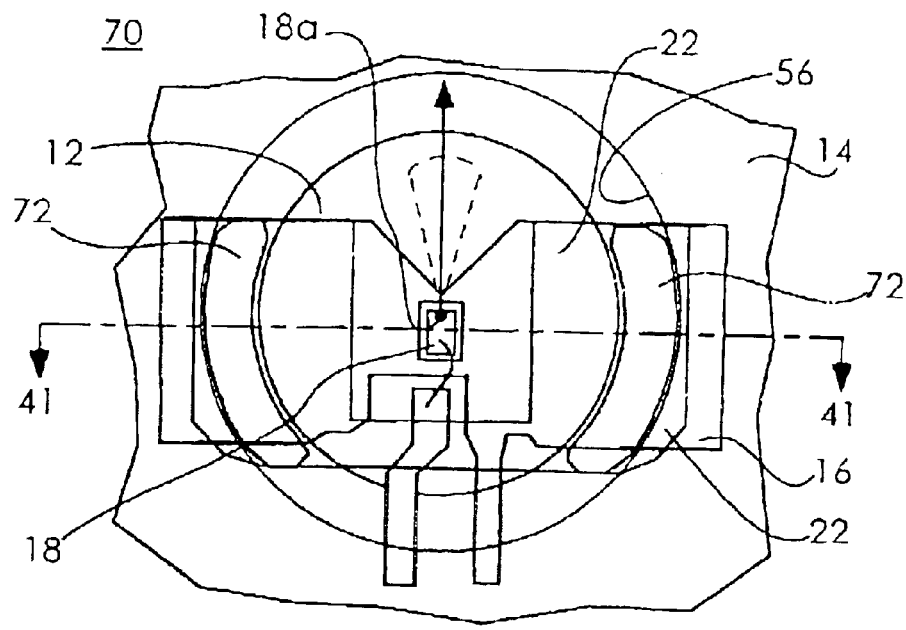
FIG. 40 is a partially-perspective plan view of an optical pickup apparatus according to one embodiment of the present invention.
Figure 41:
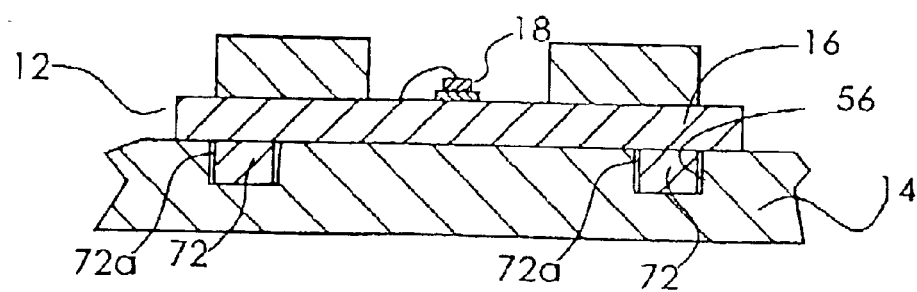
FIG. 41 is a cross-sectional view of the optical pick-up apparatus taken along line 41—41 shown in FIG. 40.

FIG. 40 is a partially-perspective plan view of an optical pickup apparatus according to a second embodiment of the invention. FIG. 41 is a cross-sectional view of the optical pick-up apparatus taken along line 41—41 shown in FIG. 40.

As shown in FIGS. 40 and 41, reference numeral 70 designates an optical pickup apparatus; and 72 designates a resin sliding section serving as a rotary pair member.

The optical pickup apparatus 70 has the resin sliding sections 72 formed on the lower surface of the metal frame 16. The resin sliding sections 72 employed in the present embodiment assume the shape of an annular protuberance. Side surfaces 72a of each resin sliding section 72 are formed as cylindrical surfaces centered on the position where the light-emitting point 18a of the semiconductor laser element 18 is set. The side surfaces 72a constitute rotary-pair surfaces.

The resin sliding sections 72 are formed from resin through molding. In many cases, the resin sliding sections 72 are formed integrally with the protective wall 22, thereby curtailing manufacturing costs. Hence, an inexpensive pickup apparatus 70 can be provided.

A counterpart rotary-pair surface which is to fitted to the resin sliding sections 72 is the side surface of the annular groove 56 formed in the optical pickup base 14. The side surface of the annular groove 56 is formed from a cylindrical surface centered on the point coinciding with the optical axis of the optical system of the optical pickup base 14.

Figure 42:
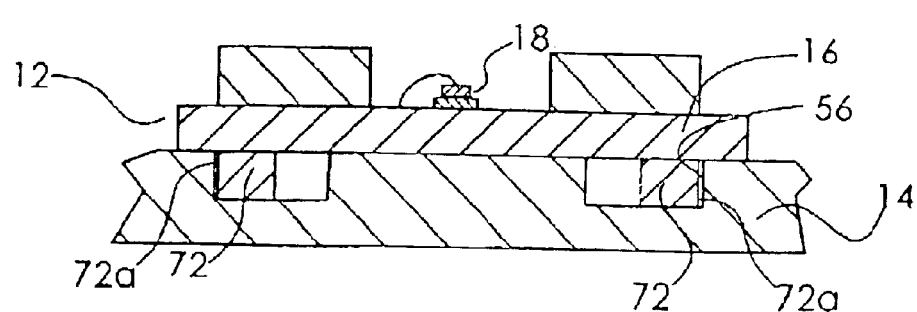
FIGS. 42 and 43 are cross-sectional views of modifications of the optical pickup apparatus according to one embodiment of the present invention.
Figure 43:
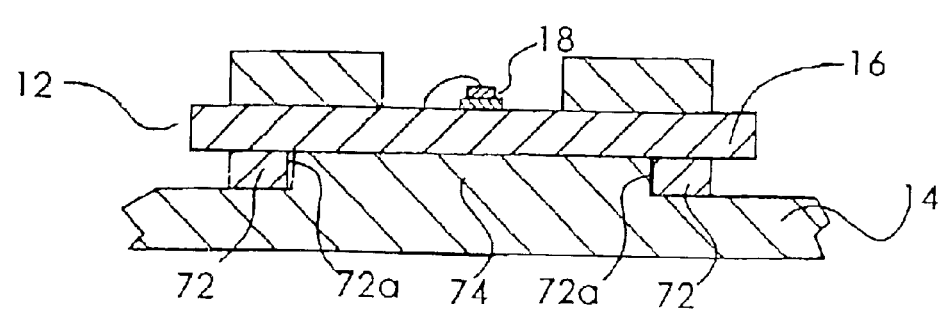

FIGS. 42 and 43 are cross-sectional views of modifications of the optical pickup apparatus according to the present embodiment.

In relation to the modification shown in FIG. 42, the resin sliding sections 72 of the semiconductor laser device 12 are identical with those shown in FIG. 41. The annular groove 56 formed in the optical pickup base 14 is made wider. As a result, outer side surfaces 72*a* of the resin sliding sections 72 are taken as a rotary-pair surface. Further, an outer side surface of the annular groove 56 formed in the optical pickup base 14 is taken as a counterpart rotary-pair surface.

In relation to the modification shown in FIG. 43, the resin sliding sections 72 of the semiconductor laser device 12 are identical with those shown in FIG. 41. A cylindrical protuberance 74 centered on the point coinciding with the optical axis of the optical system of the optical pickup base 14 is formed on the surface of the optical pickup base 14. A side surface of the cylindrical protuberance 74 is taken as a rotary-pair surface, and the inner side surfaces 72*a* of the resin sliding sections 72 are taken as a counterpart rotary-pair surface.

Figure 44:
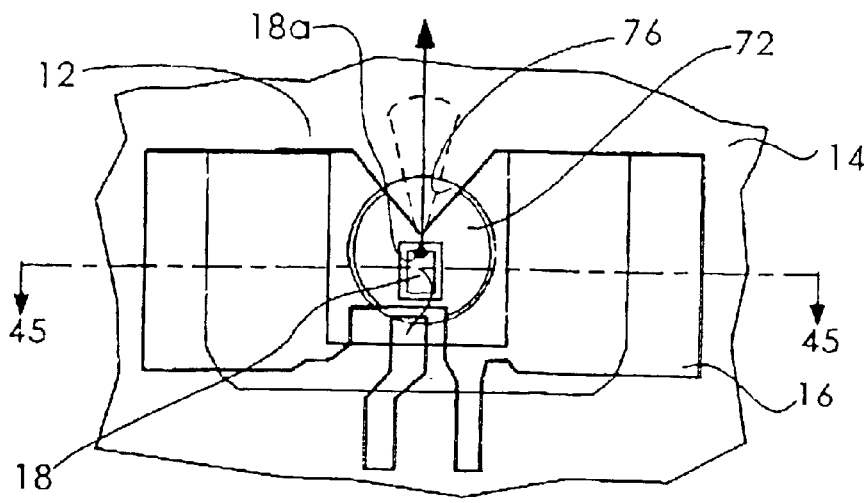
FIG. 44 is a partially-perspective plan view of a modification of the optical pickup apparatus according to one embodiment of the present invention.
Figure 45:
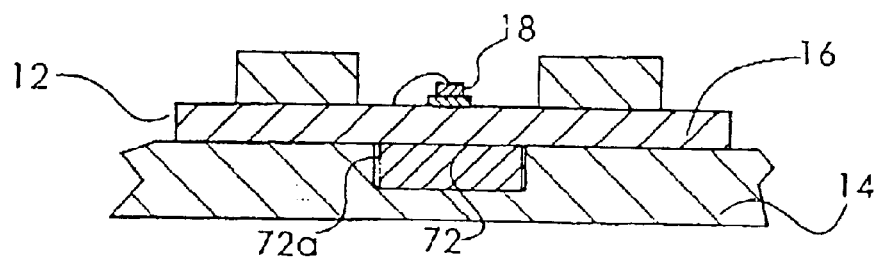
FIG. 45 is a cross-sectional view of the optical pick-up apparatus taken along line 45—45 shown in FIG. 44.

FIG. 44 is a partially-perspective plan view of a modification of the optical pickup apparatus according to the present embodiment. FIG. 45 is a cross-sectional view of the optical pick-up apparatus taken along line 45—45 shown in FIG. 44.

In the modification shown in FIGS. 44 and 45, the resin sliding section 72 is a cylindrical protuberance and is formed from a cylindrical surface centered on the point where the light-emitting point 18*a* of the semiconductor laser element 18 is set The side surface 72*a* acts as a rotary-pair surface.

Formed in the optical pickup base 14 is a cylindrical hole 76 centered on the point coinciding with the optical axis of the optical system of the optical pickup base 14. A side surface of the cylindrical hole 76 acts as a counterpart rotary-pair surface.

Figure 46:
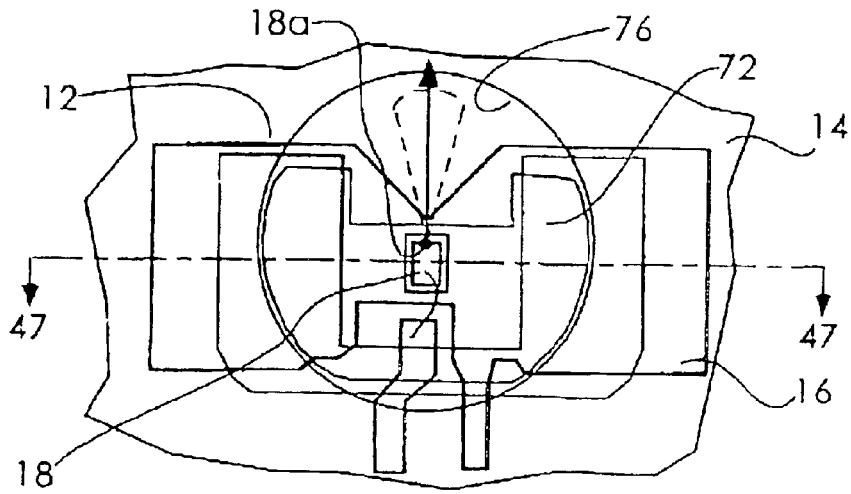
FIG. 46 is a partially-perspective plan view of a modification of the optical pickup apparatus according to one embodiment of the present invention.
Figure 47:
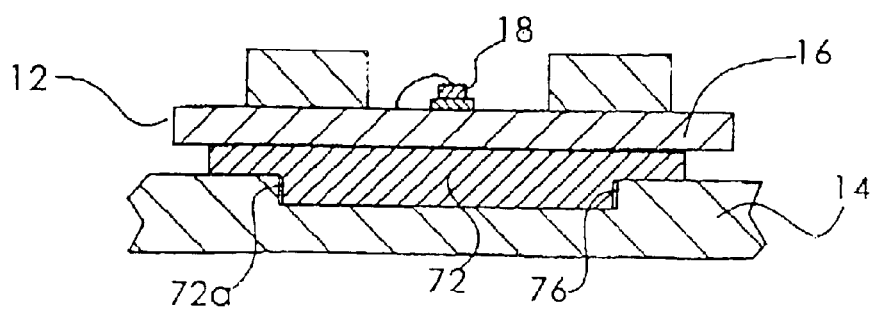
FIG. 47 is a cross-sectional view of the optical pick-up apparatus taken along line 47—47 shown in FIG. 46.

FIG. 46 is a partially-perspective plan view of a modification of the optical pickup apparatus according to the present embodiment. FIG. 47 is a cross-sectional view of the optical pick-up apparatus taken along line 47—47 shown in FIG. 46.

As in the case of the modification shown in FIGS. 44 and 45, the modification shown in FIGS. 46 and 47 employs the resin sliding section 72 constituting a cylindrical protuberance and the cylindrical hole 72 formed in the optical pickup base 14, wherein the side surface of the cylindrical hole 76 acts as a rotary-pair surface.

Here, the thickness of the cylindrical protuberance corresponds to a fraction of the thickness of the resin sliding section 72 in the case of the modification shown in FIGS. 44 and 45, and hence the cylindrical protuberance becomes shallow. Further, the radius of the outer periphery of the cylindrical protuberance is increased.

Figure 48:
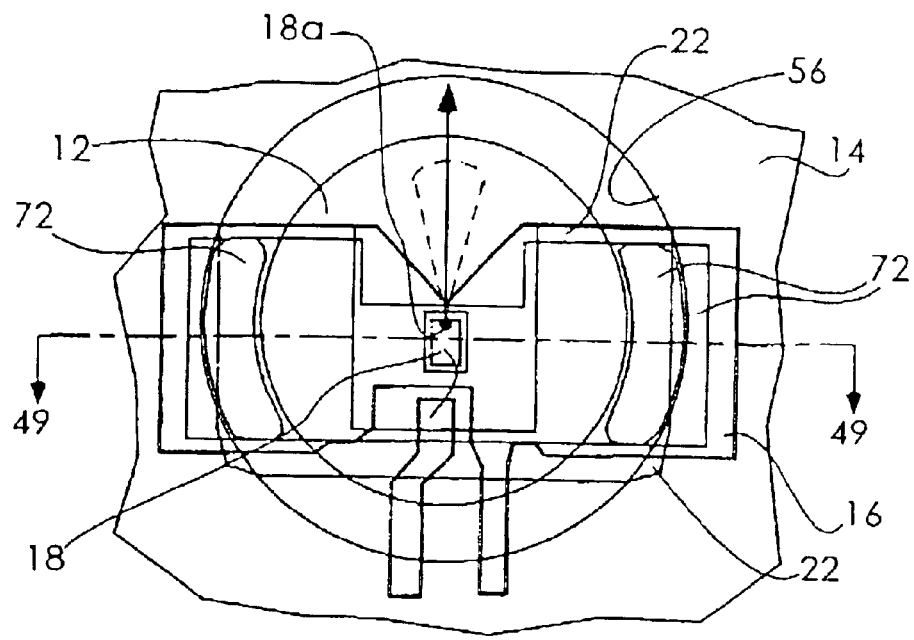
FIG. 48 is a partially-perspective plan view of a modification of the optical pickup apparatus according to one embodiment of the present invention.
Figure 49:
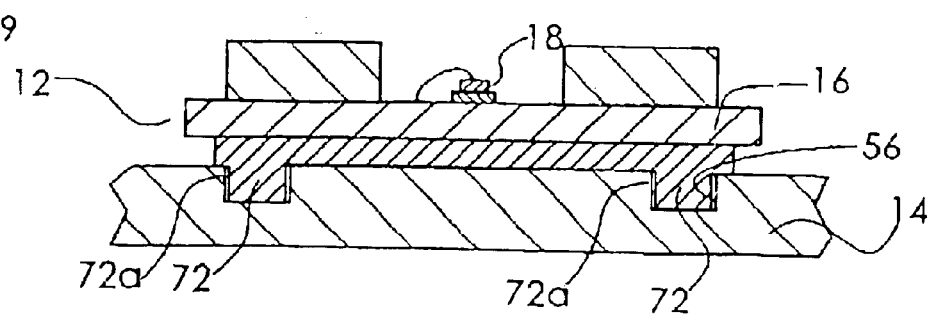
FIG. 49 is a cross-sectional view of the optical pick-up apparatus taken along line 49—49 shown in FIG. 48.

FIG. 48 is a partially-perspective plan view of a modification of the optical pickup apparatus according to the present embodiment. FIG. 49 is a cross-sectional view of the optical pick-up apparatus taken along line 49—49 shown in FIG. 48.

As in the case of the modification shown in FIGS. 40 and 41, the resin sliding section 72 in the case of the modification shown in FIGS. 48 and 49 has annular protuberances, wherein the thickness of the annular protuberances corresponds to a fraction of the thickness of the resin sliding sections 72, and the annular groove 56 is formed in the optical pickup base 14. Thus, the rotary-pair face becomes shallow.

Figure 50:
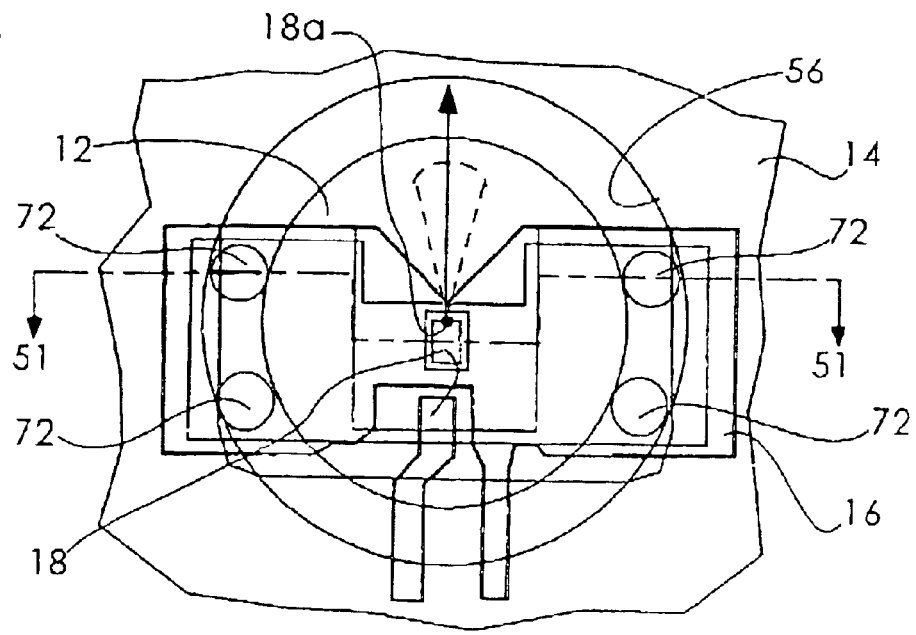
FIG. 50 is a partially-perspective plan view of a modification of the optical pickup apparatus according to one embodiment of the present invention.
Figure 51:
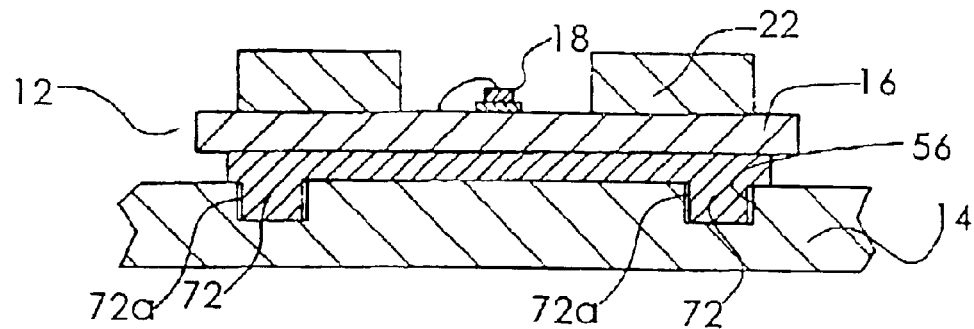
FIG. 51 is a cross-sectional view of the optical pick-up apparatus taken along line 51—51 shown in FIG. 50.

FIG. 50 is a partially-perspective plan view of a modification of the optical pickup apparatus according to the present embodiment. FIG. 51 is a cross-sectional view of the optical pick-up apparatus taken along line 51—51 shown in FIG. 50, in the case of the modification shown in FIGS. 50 and 51, the resin sliding section 72 has four cylindrical protuberances. The annular groove 56 in which the cylindrical protuberances are fitted is formed in the surface of the optical pickup base 14.

The centers of the respective cylindrical protuberances are selectively set on a single circle centered on the center point in which the light-emitting point 18*a* of the semiconductor laser element 18 is set. Accordingly, there are provided two common cylindrical contact surfaces which come into contact with side surfaces of the four cylindrical protuberances. The side surfaces of the cylindrical protuberances which come into contact with the common cylindrical contact surfaces are taken as a rotary-pair surface. Further, a counterpart rotary-pair surface is the side surface of the annular groove 56. The resin sliding sections 72 having the shape of a cylindrical protuberance are fitted into the annular groove 56 via the side surface.

In the present modification, four cylindrical protuberances are employed; however, the number of cylindrical protuberances is not limited to four.

Figure 52:
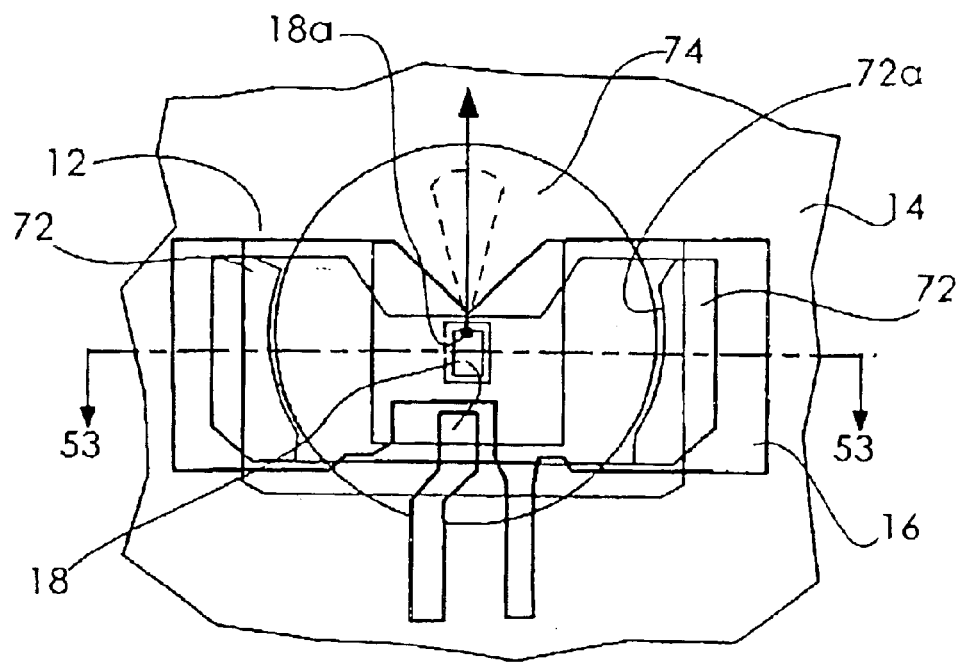
FIG. 52 is a partially-perspective plan view of a modification of the optical pickup apparatus according to one embodiment of the present invention.
Figure 53:
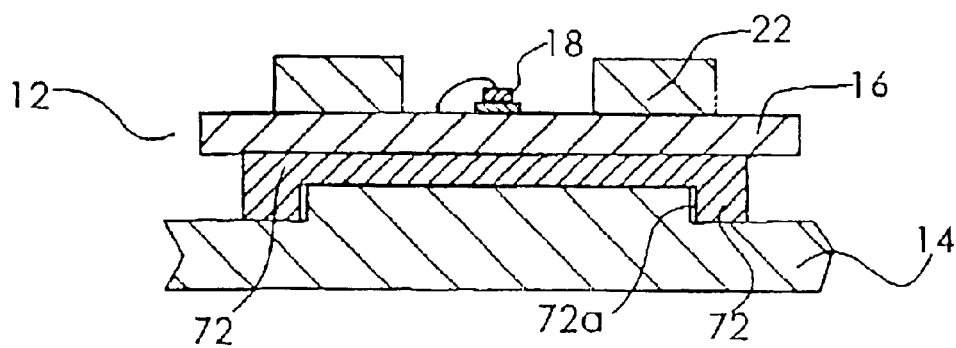
FIG. 53 is a cross-sectional view of the optical pick-up apparatus taken along line 53—53 shown in FIG. 52.

FIG. 52 is a partially-perspective plan view of a modification of the optical pickup apparatus according to the present embodiment. FIG. 53 is a cross-sectional view of the optical pick-up apparatus taken along line 53—53 shown in FIG. 52.

The modification shown in FIGS. 52 and 53 is analogous in construction to that shown in FIG. 43. The inner side surfaces of the resin sliding sections 72 are formed so as to constitute portions of an inner cylindrical surface centered on the position where the light-emitting 18*a* of the semiconductor laser element 18 is set. The side surfaces 72*a* serve as a rotary-pair surface. The thickness of the inner cylindrical surfaces 72*a* is formed corresponds to a fraction of the thickness of the resin sliding sections 72. Accordingly, the rotary-pair surfaces become shallower than those shown in FIG. 44. The counterpart rotary-pair surface formed on the surface of the optical pickup base 14 is identical in construction with that shown in FIG. 43.

Figure 54:
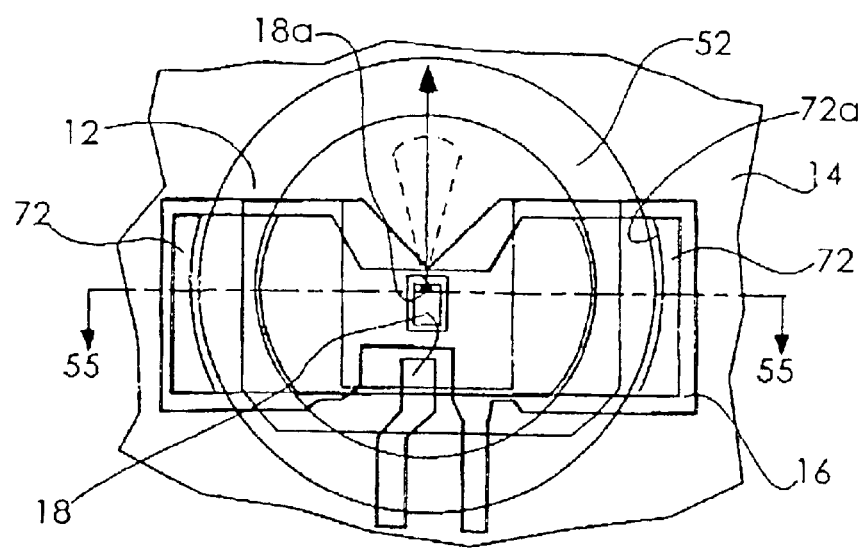
FIG. 54 is a partially-perspective plan view of a modification of the optical pickup apparatus according to one embodiment of the present invention.
Figure 55:
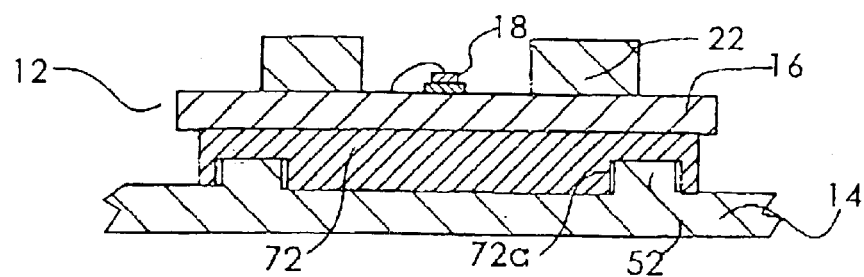
FIG. 55 is a cross-sectional view of the optical pick-up apparatus taken along line 55—55 shown in FIG. 54.

FIG. 54 is a partially-perspective plan view of a modification of the optical pickup apparatus according to the present embodiment. FIG. 55 is a cross-sectional view of the optical pick-up apparatus taken along line 55—55 shown in FIG. 54.

The modification shown in FIGS. 54 and 55 has a construction embodied by interchanging the groove and the protuberances shown in FIGS. 48 and 49. The resin sliding section 72 has an annular groove, and the inner side surface 72*a* of the resin sliding section 72 is formed of a cylindrical surface centered on the position where the light-emitting point 18*a* of the semiconductor laser element 18 is set. The side surface 72*a* acts as a rotary-pair surface.

A counterpart rotary-pair surface to be fitted to the resin sliding section 72 is a side surface of the annular protuberance 52 formed on the optical pickup base 14. The side surface of the annular protuberance 52 is formed as a cylindrical surface centered on the point coinciding with the optical axis of the optical system of the optical pickup base 14.

In the modification, the annular groove of the resin sliding section 72 corresponds to a fraction of the thickness of the resin sliding section 72, and hence the rotary-pair surface becomes shallow.

Figure 56:
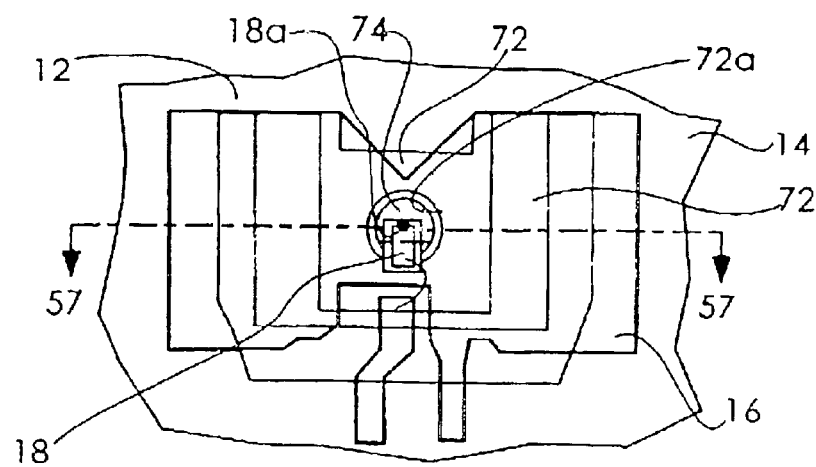
FIG. 56 is a partially-perspective plan view of a modification of the optical pickup apparatus according to one embodiment of the present invention.
Figure 57:
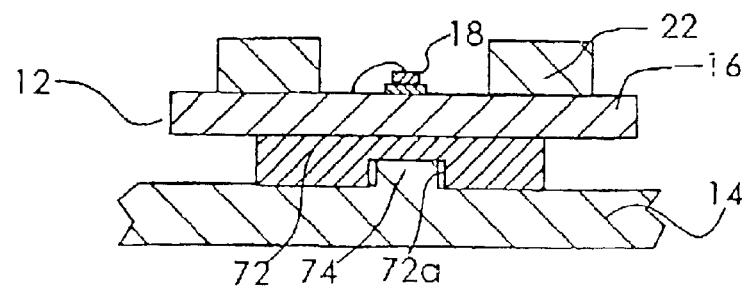
FIG. 57 is a cross-sectional view of the optical pick-up apparatus taken along line 57—57 shown in FIG. 56.

FIG. 56 is a partially-perspective plan view of a modification of the optical pickup apparatus according to the present embodiment. FIG. 57 is a cross-sectional view of the optical pick-up apparatus taken along line 57—57 shown in FIG. 56.

The modification shown in FIGS. 56 and 57 is analogous in construction to that shown in FIGS. 52 and 53. The radius of a cylindrical recess formed in the resin sliding section 72 is made smaller than the radius shown in FIGS. 52 and 53. Further, the entire side surface of the recess is taken as a rotary-pair surface.

In the optical pickup apparatus according to the embodiment, the resin sliding section 72 is provided on the lower surface of the metal frame 16. The side surface of the resin sliding section 72 or the side surface of a recess or protuberance formed in or on the end face of the resin sliding section 72 is taken as a rotary-pair surface. Further, a counterpart rotary-pair surface is formed on the optical pickup base 14. The semiconductor laser device 12 and the optical pickup base 14 are cemented together by way of the rotary-pair surfaces, thus constructing the optical pickup apparatus.

As in the case of the first embodiment, there can be readily corrected angular misalignment between the optical axis of the optical system of the optical pickup base 14 and the optical axis of the laser beam originating from the semiconductor laser device 12.

The protective wall 22 and the resin sliding section 72 can be produced integrally, whereby costs incurred in producing a rotary-pair are curtailed.

When the resin sliding section 72 is constituted in to an annular protuberance or a cylindrical protuberance, a low degree of hardening and shrinkage arises in the cases shown in, e.g. FIGS. 40 through 44, 48, and 50. Clearance between mutually-opposing rotary-pair surfaces becomes smaller. Hence, misalignment between the light-emitting point 18a of the semiconductor laser element 18 and the center point, of the circular arc defined by the guide 28 of the optical pickup base 14 becomes smaller. Hence, there can be diminished angular misalignment or parallel deviation existing between the optical axis of the laser beam originating from the light-emitting point 18a of the semiconductor laser element 18 and the optical axis of the optical system mounted on the optical pickup base 14.

When a recess is formed in the end face of the resin sliding section 72, the end surface around the recess is satin-finished, and the bottom of the recess is made smooth. As a result, the bottom surface can be used as an image recognition target, and the semiconductor laser element 18 can be die-bonded accurately.

When a recess or protuberance is formed in or on the end face of the resin sliding section 72; for example, in the cases shown in FIGS. 48, 50, 52, 54, and 56, the semiconductor laser device 12 and the optical pickup base 14 are temporarily heated after having been positioned through use of thermoplastic resin. The semiconductor laser device 12 and the optical pickup base 14 are again fused and fastened. Thus, the semiconductor laser device and the optical pickup base can be readily fastened without use of an adhesive, thereby simplifying manufacturing processes and curtailing costs.

By extension, an optical pickup apparatus having a superior optical characteristic can be constructed inexpensively.
Third Embodiment FIG. 58 is a partially-perspective plan view of a optical pickup apparatus according to the present embodiment, FIG. 59 is a cross-sectional view of the optical pick-up apparatus taken along line 59—59 shown in FIG. 58.

Figure 58:
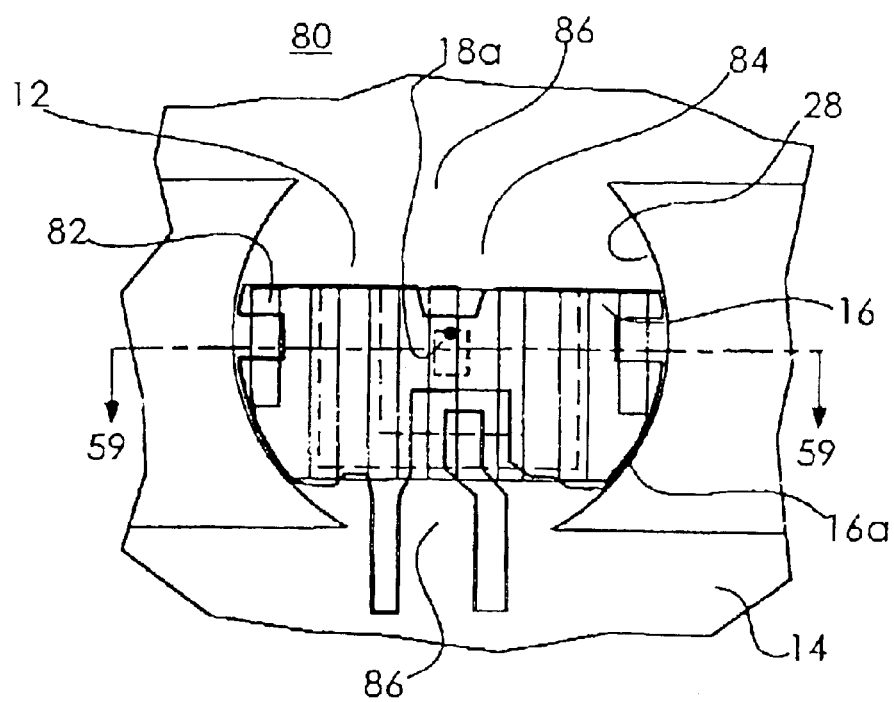
FIG. 58 is a partially-perspective plan view of a optical pickup apparatus according to one embodiment of the present invention.
Figure 59:
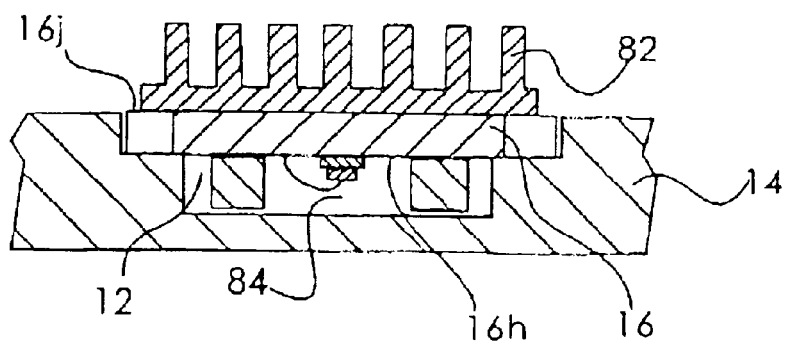
FIG. 59 is a cross-sectional view of the optical pick-up apparatus taken along line 59—59 shown in FIG. 58.

As shown in FIGS. 58 and 59, reference numeral 80 designates an optical pickup apparatus; and 16h designates a chip mount surface of the metal frame 16 which also serves as the first primary surface of the substrate. Reference numeral 16j designates a back surface of the metal frame 16 which also serves as the second primary surface of the substrate. Reference numeral 82 designates a cooling fin which is bonded to the back surface 16j of the metal frame 16. Reference numeral 84 designates a storage section for storing the protective wall 22 and the semiconductor laser element 18. Reference numeral 86 designates an opening section for emanating the laser beam 40 from the storage section 84. The opening section 86 is formed in the side of the optical pickup apparatus 80 facing monitor light as well as in the other side of the same facing the principal luminous flux.

The optical pickup apparatus 80 causes the chip mount surface 16h of the metal frame 16 to oppose the optical pickup base 14. The chip mount surface 16h of the metal frame 16 of the semiconductor laser device is disposed on the surface of the optical pickup base 14 such that the back surface 16j of the metal frame 16 faces outside.

An outer periphery of the metal frame 16 in the semiconductor laser device 12 constitutes the circumference portion 16a which is a rotary-pair surface. The guide 28 serving as a counterpart rotary-pair surface is formed on the optical pickup base 14. The semiconductor laser device 12 is mounted on the optical pickup base 14 by way of the circumference portion 16a fitted to the guide 28.

Figure 60:
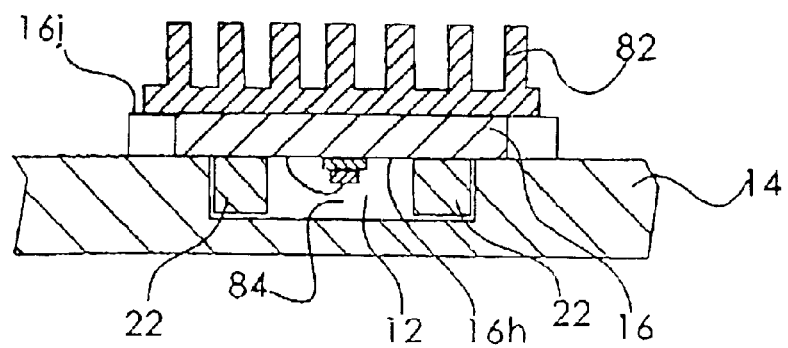
FIG. 60 is a cross-sectional view of the optical pickup apparatus according to one embodiment of the present invention, showing a modification of the optical pickup apparatus.

FIG. 60 is a cross-sectional view of the optical pickup apparatus, showing a modification of the optical pickup apparatus according to the third embodiment.

In the modification shown in FIG. 60, an outer periphery of the protective wall 22 of the semiconductor laser device 12 constitutes a rotary-pair surface located on the semiconductor laser device 12.

Figure 61:
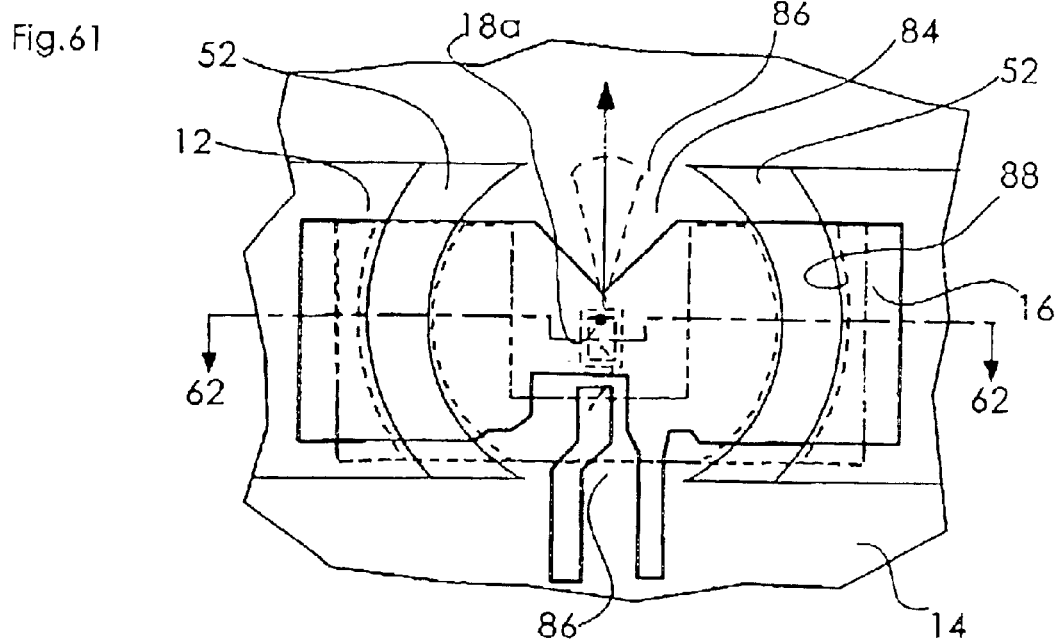
FIG. 61 is a partially-perspective plan view of a modification of the optical pickup apparatus according to one embodiment of the present invention.
Figure 62:
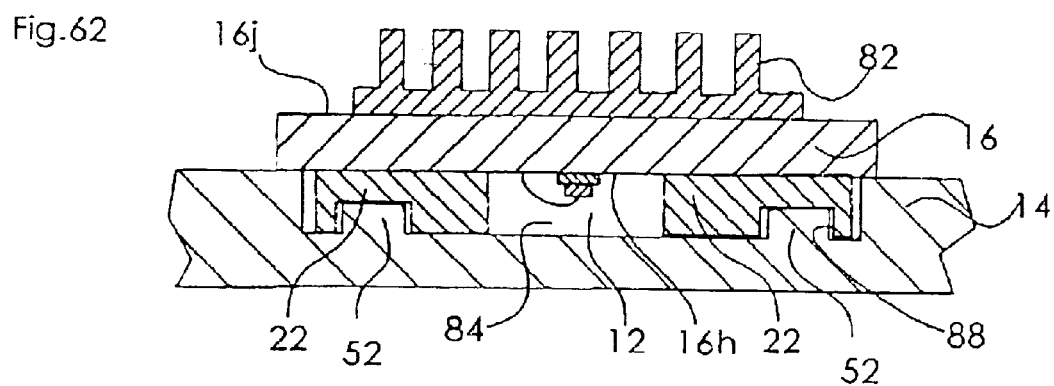
FIG. 62 is a cross-sectional view of the optical pick-up apparatus taken along line 62—62 shown in FIG. 61.

FIG. 61 is a partially-perspective plan view of a modification of the optical pickup apparatus according to the present embodiment. FIG. 62 is a cross-sectional view of the optical pick-up apparatus taken along line 62—62 shown in FIG. 61. Here, the cooling fin 82 is omitted from FIG. 61. The same also applies to FIGS. 63, 65, and 67.

The modification shown in FIGS. 61 and 62 relates to a construction in which annular grooves 88 are formed in a top end face of the protective wall 22. Side surfaces of the annular grooves 88 constitute rotary-pair surfaces located on the semiconductor laser device 12. The annular protuberances 52 are provided on the bottom surface of the storage section 84 of the optical pickup base 14, and the side surfaces of the annular protuberances 52 constitute counterpart rotary-pair surfaces located on the optical pickup base 14.

Figure 63:
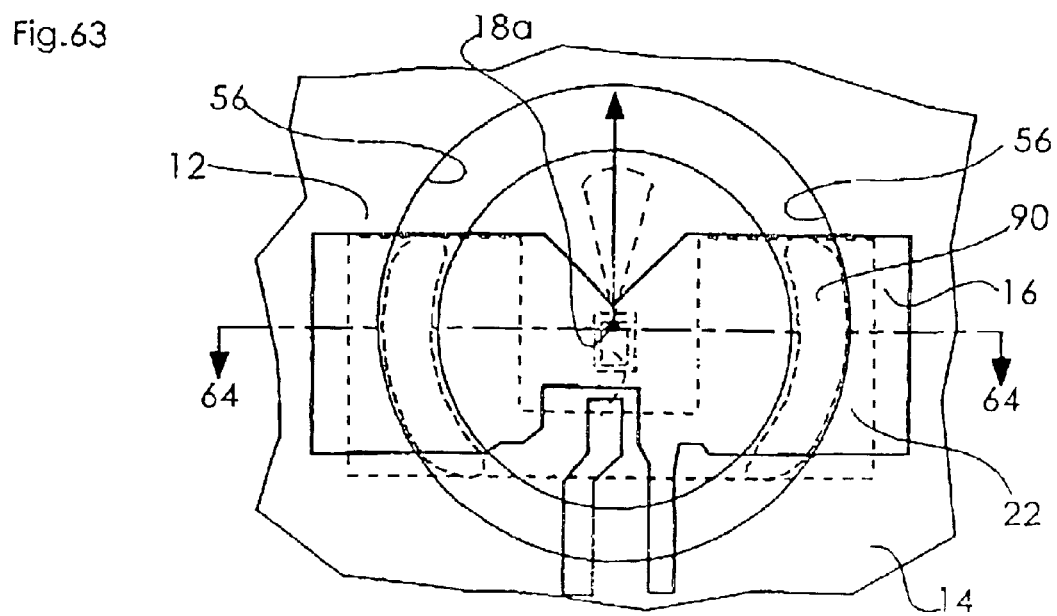
FIG. 63 is a partially-perspective plan view of a modification of the optical pickup apparatus according to one embodiment of the present invention.
Figure 64:
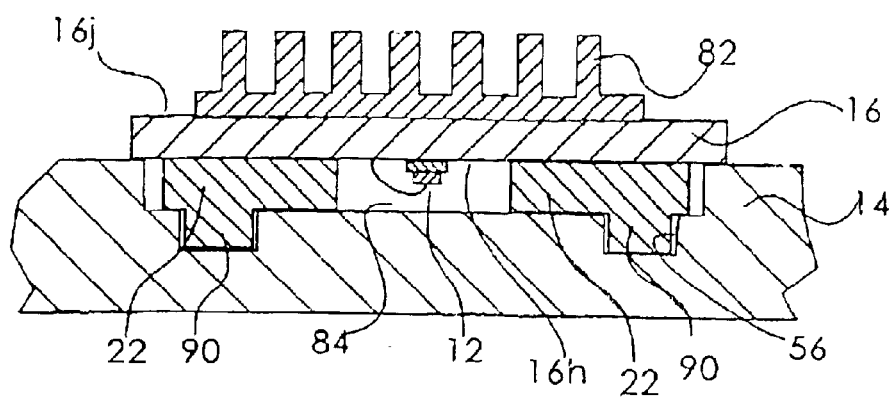
FIG. 64 is a cross-sectional view of the optical pick-up apparatus taken along line 64—64 shown in FIG. 63.

FIG. 63 is a partially-perspective plan view of a modification of the optical pickup apparatus according to the present embodiment. FIG. 64 is a cross-sectional view of the optical pick-up apparatus taken along line 64—64 shown in FIG. 63.

The modification shown in FIGS. 63 and 64 relates to a construction in which annular protuberances 90 are provided on the top end face of the protective wall 22. Side surfaces of the annular protuberances 90 constitute rotary-pair surfaces of the semiconductor laser device 12. The annular groove 56 is provided in the bottom surface of the storage section 84 of the optical pickup base 14, and the side surfaces of the annular groove 56 constitute counterpart rotary-pair surfaces located on the optical pickup base 14.

Figure 65:
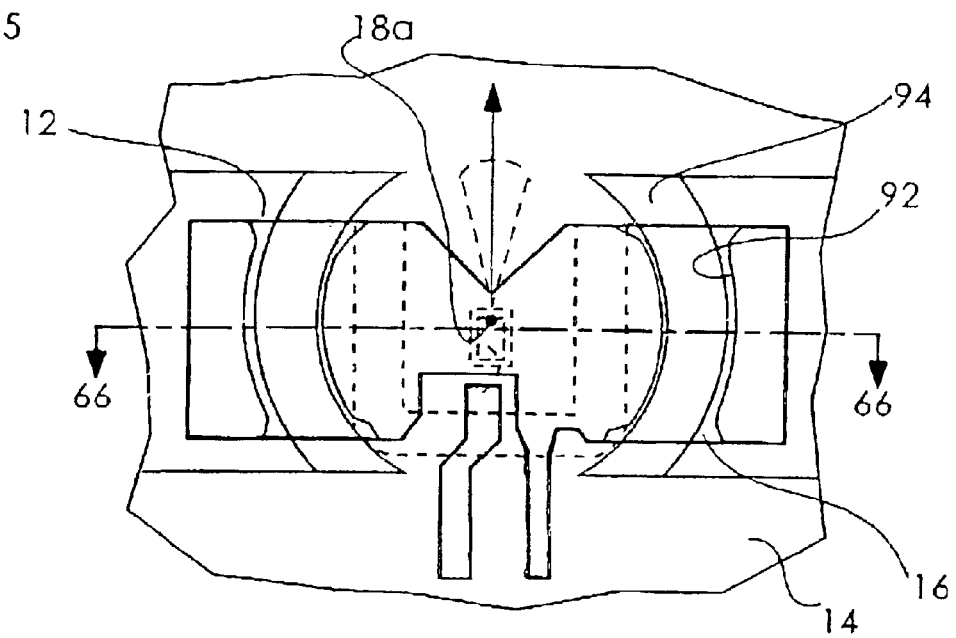
FIG. 65 is a partially-perspective plan view of a modification of the optical pickup apparatus according to one embodiment of the present invention.
Figure 66:
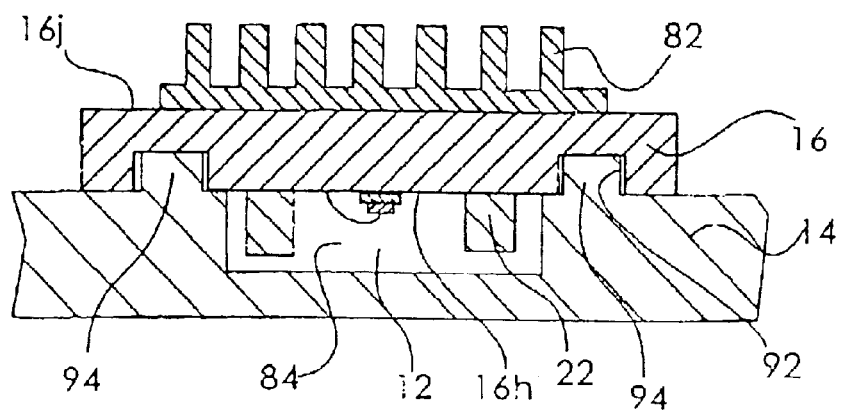
FIG. 66 is a cross-sectional view of the optical pick-up apparatus taken along line 66—66 shown in FIG. 65.

FIG. 65 is a partially-perspective plan view of a modification of the optical pickup apparatus according to the present embodiment. FIG. 66 is a cross-sectional view of the optical pick-up apparatus taken along line 66—66 shown in FIG. 65.

The modification shown in FIGS. 65 and 66 relates to a construction in which annular grooves 92 are formed in the chip mount surface 16h of the metal frame 16. Side surfaces of the annular grooves 92 constitute rotary-pair surfaces located on the semiconductor laser device 12. Annular protuberances 94 are provided on the surface of the optical pickup base 14, and the side surfaces of the annular protuberances 94 constitute counterpart rotary-pair surfaces located on the optical pickup base 14.

Figure 67:
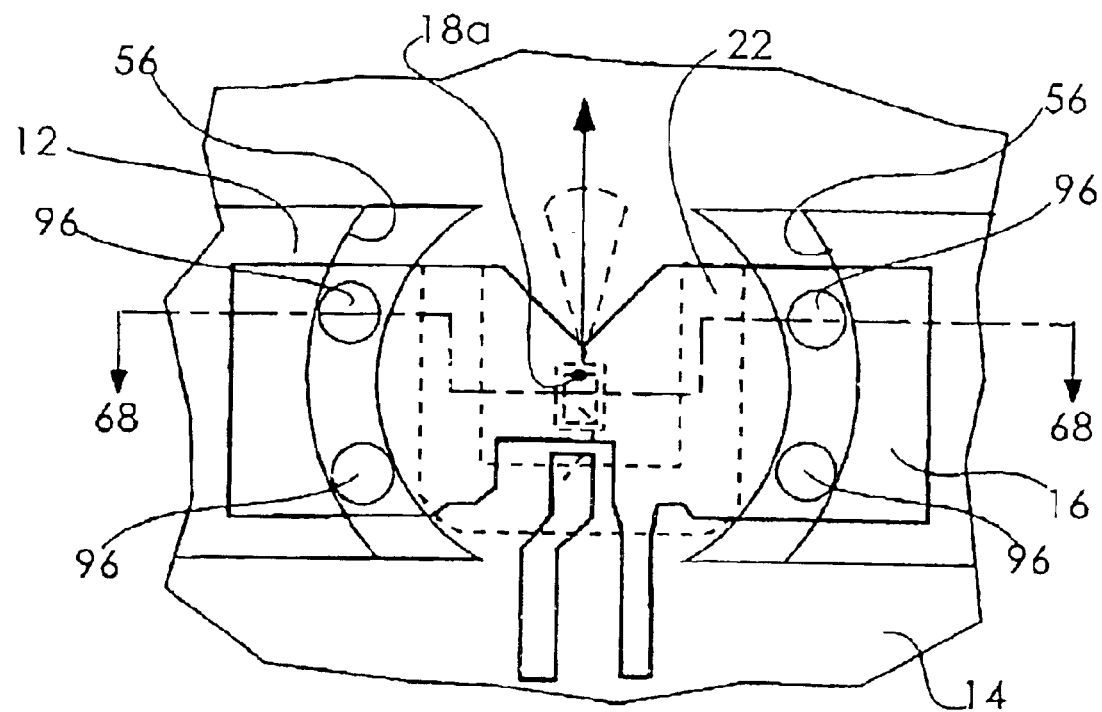
FIG. 67 is a partially-perspective plan view of a modification of the optical pickup apparatus according to one embodiment of the present invention.
Figure 68:
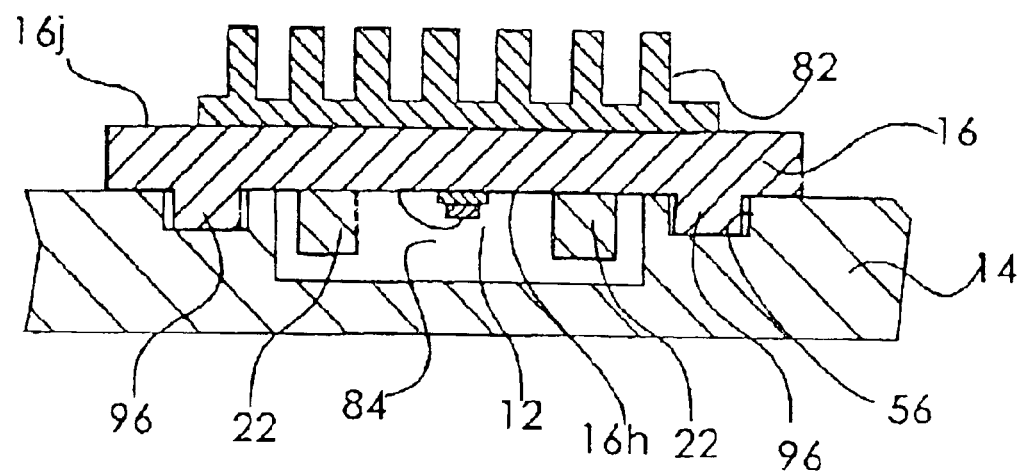
FIG. 68 is a cross-sectional view of the optical pick-up apparatus taken along line 68—68 shown in FIG. 67.
Figure 69:
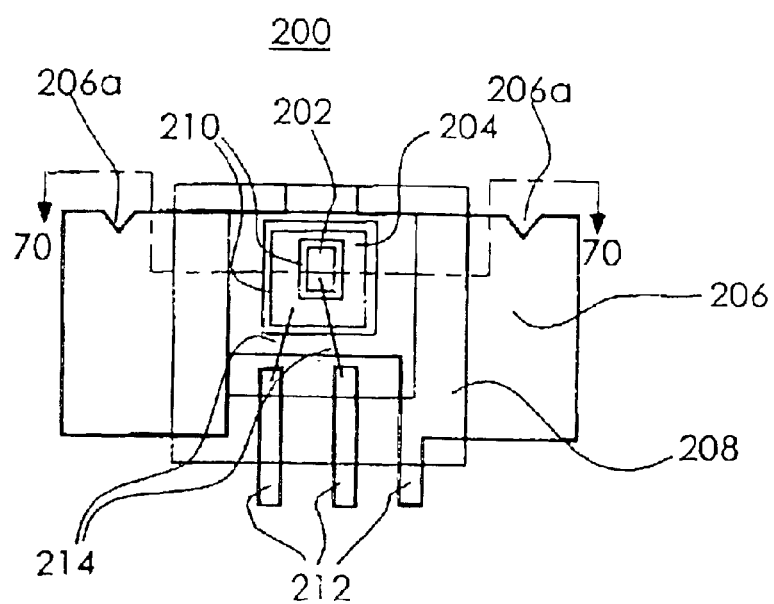
FIG. 69 is a related-art semiconductor laser device.
Figure 70:
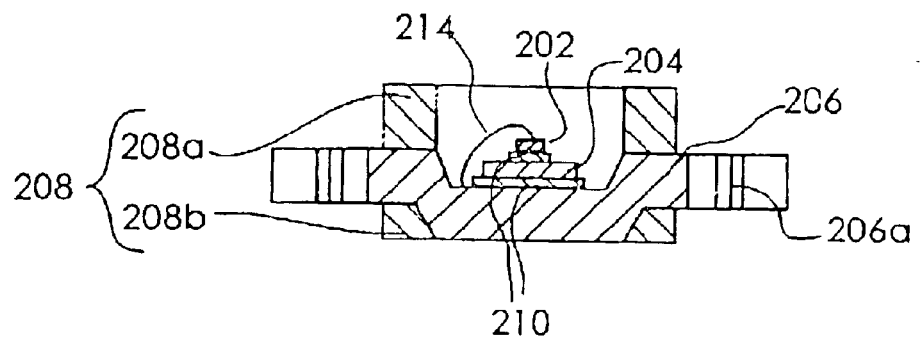
FIG. 70 is a cross-sectional view taken along line 70—70 shown in FIG. 69.
Figure 71:
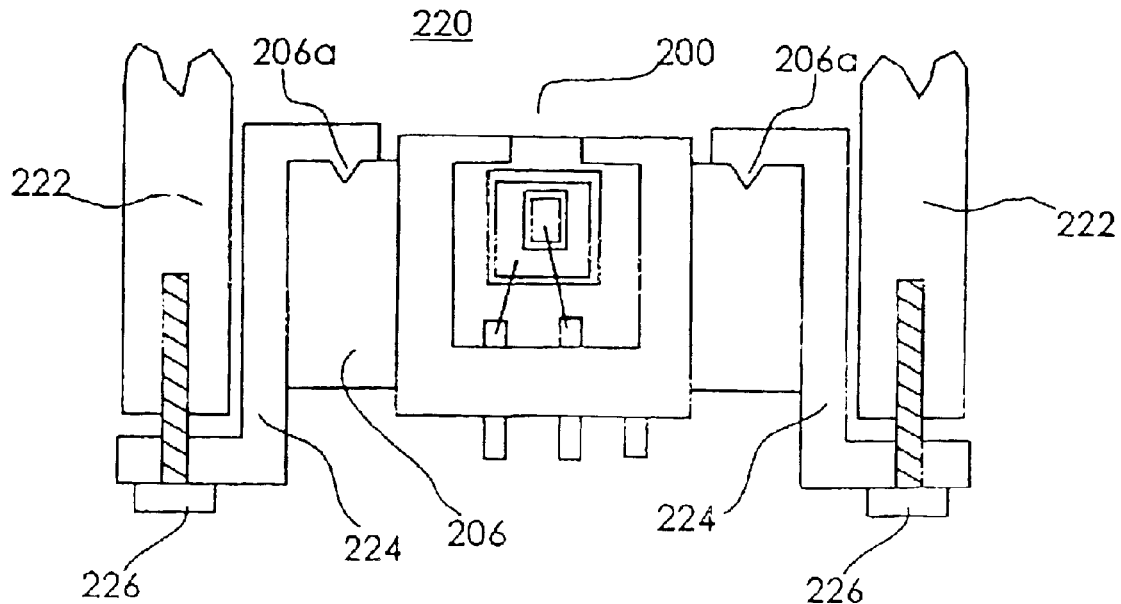
FIG. 71 is a partial plan view of a related-art optical pickup apparatus.
Figure 72:
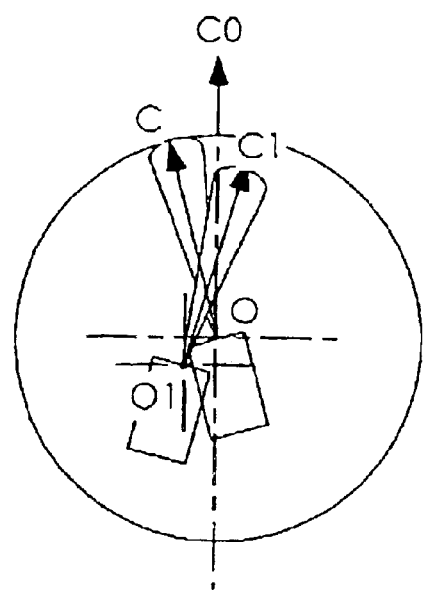
FIG. 72 is a schematic view for describing movement of the light-emitting point through related-art angular adjustment of the optical axis.
Figure 73:
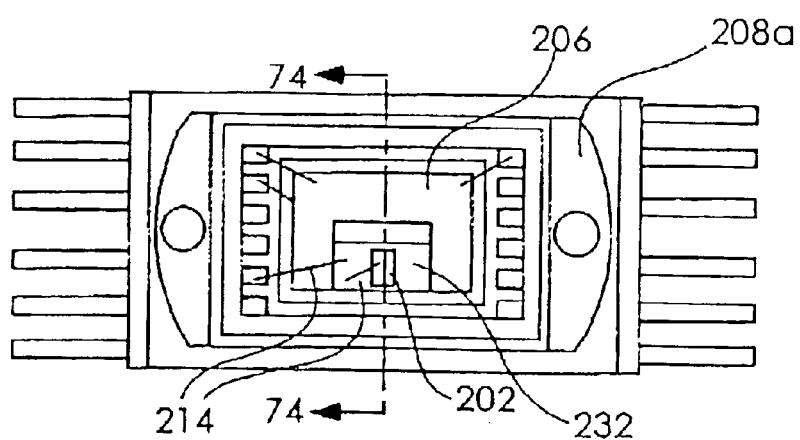
FIG. 73 is a plan view of another related-art semiconductor laser device.
Figure 74:
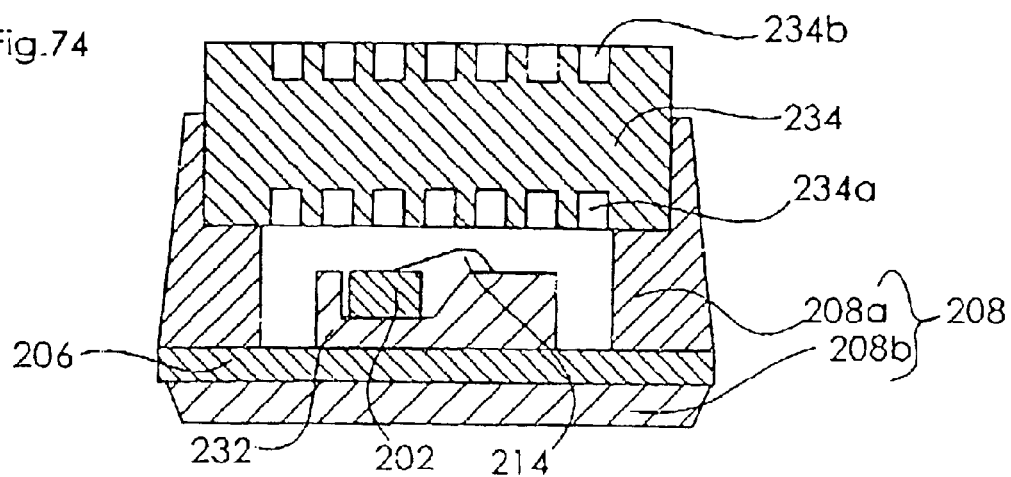
FIG. 74 is a cross-sectional view of the semiconductor laser device taken along line 74—74 shown in FIG. 73.
Figure 75:
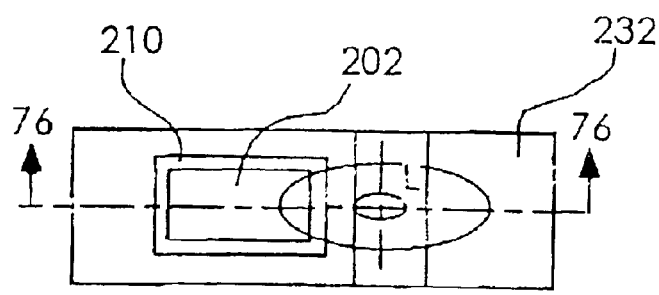
FIG. 75 is a plan view showing a related-art mirror and semiconductor element.
Figure 76:
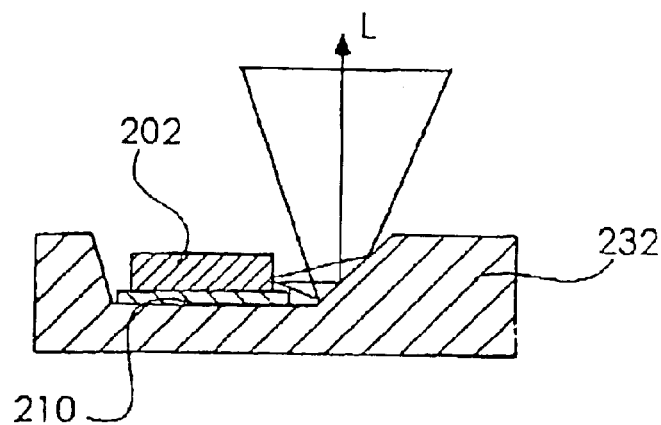
FIG. 76 is a cross-sectional view of the mirror and semiconductor laser element taken along line 76—76 shown In FIG. 75.
Figure 77:
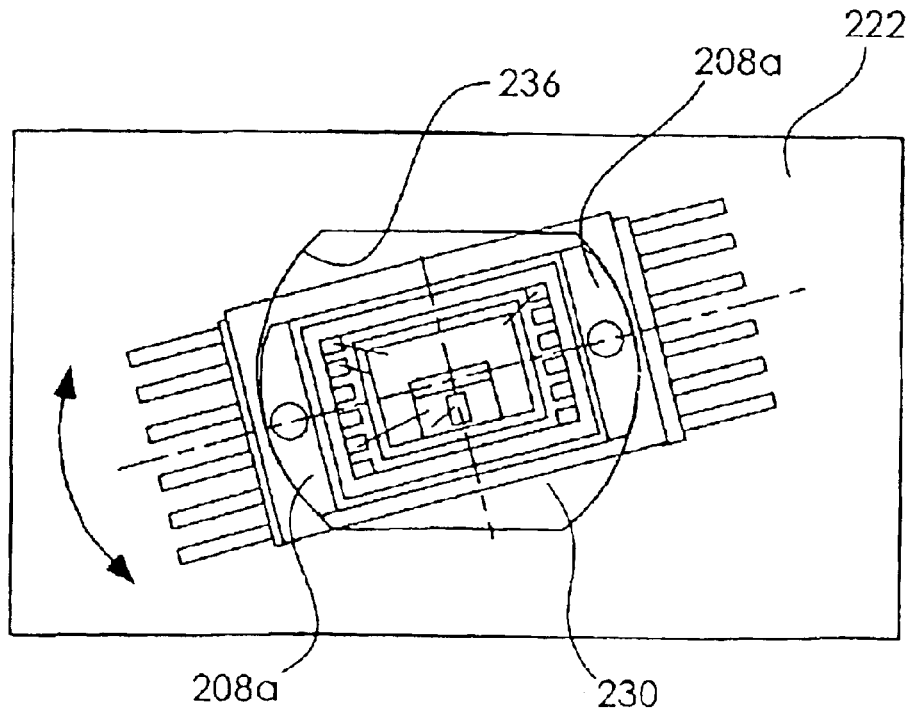
FIG. 77 is a partially-perspective plan view of the related-art optical pickup apparatus.

FIG. 67 is a partially-perspective plan view of a modification of the optical pickup apparatus according to the present embodiment. FIG. 68 is a cross-sectional view of the optical pick-up apparatus taken along line 68—68 shown in FIG. 67.

The modification shown in FIGS. 67 and 68 relates to a construction in which cylindrical projections 96 are provided on the chip mount surface 16h of the metal frame 16. The annular grooves 56 to be fitted with the cylindrical projections 96 are formed in the surface of the optical pickup base 14. The center of the four cylindrical projections 96 provided on the chip mount surface 16h of the metal frame 16 is set on a circle centered on the position where the light-emitting point 18a of the semiconductor laser element 18 is set. Accordingly, there are provided two common cylindrical contact surfaces which come into contact with side surfaces of the four cylindrical protuberances 94. The side surfaces of the cylindrical protuberances 94 which come into contact with the common cylindrical contact surfaces are taken as rotary-pair surfaces.

Further, counterpart rotary-pair surfaces are the side surfaces of the annular grooves 56. In the present modification, four cylindrical protuberances 94 are employed; however, the number of cylindrical protuberances is not limited to four.

As mentioned above, in relation to the optical pickup apparatus according to the embodiment the rotary-pair surface located on the semiconductor laser device 12 is provided on the side surface of the metal frame 16, the protective wall 22, or the mount surface 16h of the metal frame 16. Further, a counterpart rotary-pair surface is provided on the optical pickup base 14. As in the case of the first embodiment, angular misalignment existing between the optical axis of the optical system of the optical pickup base 14 and the optical axis of the laser beam originating from the semiconductor laser device 12 can be readily adjusted.

The chip mount surface 16h of the metal frame 16 which is formed with high surface accuracy as a reference surface with reference to a direction of plane of the metal frame 16 is disposed on the surface of the optical pickup base 14 which is formed with high surface accuracy as a reference surface with reference to a direction of plane of the optical pickup base 14. There is no necessity for taking into consideration thickness tolerance of the metal frame 16. The positional accuracy of the light-emitting point 18a of the semiconductor laser element 18 in the vertical direction with reference to the optical pickup base 14 can be enhanced.

Since the semiconductor laser device 12 acts as a closure, thereby diminishing the chance of waste, such as dust particles, adhering to the semiconductor laser element 18.

Further, the cooling fin 82 is mounted on the back surface 16j of the metal frame 16, thereby efficiently dissipating heat in the semiconductor laser device 12.

By extension, a reliable optical pickup apparatus having a superior optical characteristic can be constructed.

Even if the shading prevention mechanism or the U-shaped holes formed in the metal frame to be used for insertion of a rotary control jig, which have been described in connection with the first embodiment, is applied to the other embodiment, there will be yielded the same advantaged as that yielded in the first embodiment.

The semiconductor laser device according to the invention and the optical pickup apparatus using the device have constructions such as those described above and yield the following advantages.

A semiconductor laser device according to the invention comprises: a substrate having mutually-opposing first and second primary surfaces; a semiconductor laser element which is mounted an the first primary surface of the substrate and emits light having an optical axis along the primary surface; a wall member which is provided on the first primary surface of the substrate and surrounds the semiconductor laser element, except for the direction of the optical axis of the light originating from the semiconductor laser element; and a rotary-pair surface for rotating the optical axis of the light originating from the semiconductor laser element around a light-emitting point on an exit end face of the semiconductor laser element in a direction along the primary surface of the substrate, wherein the semiconductor laser device emits light having an optical axis along the primary surface of the substrate. Hence, angular misalignment of the optical axis of light originating from the semiconductor laser element can be corrected readily by means of aligning a rotary-pair surface located on the semiconductor laser device with a counterpart rotary-pair surface. By extension, there can constructed an optical pickup apparatus which facilitates alignment of optical axis of the semiconductor laser device.

Further, a first notch section having a width greater than the range of dispersion of the light originating from the semiconductor laser element is formed in a front edge of the substrate, and the exit end face of the semiconductor laser element is disposed adjacent to a bottom of the first notch section. There can be prevented occurrence of shading, which would otherwise be caused by a substrate on which is mounted a semiconductor laser element for emitting light. Thus, there can be constructed a semiconductor laser device having a high output efficiency. By extension, there can be constructed an optical pickup apparatus having a superior laser beam output characteristic.

Moreover, a protuberance is provided on the first primary surface of the substrate, and the semiconductor laser element is disposed on a top surface of the protuberance. There can be prevented occurrence of shading, which would otherwise be caused by a substrate on which is mounted a semiconductor laser element for emitting light. Thus, there can be constructed a semiconductor laser device having a high output efficiency. By extension, there can be constructed an optical pickup apparatus having a superior laser beam output characteristic.

Further, a second notch section is formed in a side surface of the substrate spaced away from the direction of optical axis of the light originating from the semiconductor laser element. By means of the second notch section, rotation of the rotary-pair surface provided on the semiconductor laser device is facilitated. For this reason, control of minute rotation of the rotary-pair surface with reference to the counterpart rotary-pair surface can be facilitated. By extension, there can constructed an optical pickup apparatus which facilitates alignment of optical axis of the semiconductor laser device.

Further, the substrate has a rotary-pair surface. There can be constructed a semiconductor laser device having a rotary-pair surface of high dimensional accuracy. By extension, there can be constructed an optical pickup apparatus having a superior optical characteristic.

The rotary-pair surface is constituted of a side surface of the substrate. Hence, the construction of the rotary-pair surface becomes simple, and dimensional accuracy of the rotary-pair surface is improved. There can be constructed a semiconductor laser device involving a small error in position where a chip is to be mounted. By extension, there can be constructed an optical pickup apparatus involving a lesser amount of optical misalignment.

Further, a protuberance or recess is formed on or in the first primary surface of the substrate, and the rotary-pair surface is constituted of a side surface of the protuberance or recess. As a result, when an optical pickup apparatus is constructed, the first primary surface of the substrate can be taken as a reference surface in the direction perpendicular to the substrate. There is no necessity of taking into consideration thickness tolerance of the substrate. There can be diminished misalignment of the optical axis of the optical pickup apparatus in the direction perpendicular to the substrate. By extension, there can be constructed an optical pickup apparatus having a superior optical characteristic.

Further, a protuberance or recess is formed on or in the second primary surface of the substrate, and the rotary-pair surface is constituted of a side surface of the protuberance or recess. The second primary surface can be used as a heat sinking plane. By extension, there can be constructed an optical pickup apparatus having superior cooling performance.

Moreover, the wall member has the rotary-pair surface. When an optical pickup apparatus is constructed, the first primary surface of the substrate can be taken as a reference surface in the direction perpendicular to the substrate. There is no necessity of taking into consideration thickness tolerance of the substrate. There can be diminished misalignment of the optical axis of the optical pickup apparatus in the direction perpendicular to the substrate. By extension, there can be constructed an optical pickup apparatus having a superior optical characteristic.

The rotary-pair surface is constituted of a side surface of the wall member. The rotary-pair surface can be formed readily. By extension, there can be manufactured an inexpensive optical pickup apparatus.

A protuberance or recess is formed on or in the top of the wall member, and the rotary-pair surface is constituted of a side surface of the protuberance or recess. The protuberance or recess can be produced with high dimensional accuracy. Further, the fitting accuracy of the rotary-pair can be enhanced. By extension, there can be manufactured an inexpensive optical pickup apparatus having a superior optical characteristic.

A cooling fin is provided on the second primary surface of the substrate. Hence, the cooling performance of the optical pickup apparatus can be enhanced. For this reason, there can be constructed a semiconductor laser device with high reliability. By extension, there can be manufactured a highly-reliable optical pickup apparatus.

A rotary-pair member is provided on the second primary surface of the substrate, and a rotary-pair surface is provided on the rotary-pair member. The rotary-pair can be provided in a simple construction. By extension, there can be produced an inexpensive optical pickup apparatus involving simple alignment of an optical axis.

Moreover, the rotary-pair surface is constituted of a side surface of the rotary-pair member. The rotary-pair can be provided in a simple construction. By extension, there can be produced an inexpensive optical pickup apparatus.

Further, a protuberance or recess is formed on or in the top of the rotary-pair member, and the rotary-pair surface is constituted of a side surface of the protuberance or recess. The protuberance or recess can be produced with high dimensional accuracy. Further, the fitting accuracy of the rotary-pair-can be enhanced. By extension, there can be manufactured an inexpensive optical pickup apparatus having a superior optical characteristic.

Moreover, the rotary-pair member is formed from resin through molding. There can be manufactured an inexpensive semiconductor laser device, and, by extension, there can be produced an inexpensive optical pickup apparatus.

Further, the wall member is formed from resin through molding. There can be manufactured an inexpensive semiconductor laser device, and, by extension, there can be produced an inexpensive optical pickup apparatus.

Furthermore, the substrate is formed from metal. The substrate can be made thinly and with a high degree of dimensional accuracy. A semiconductor laser device can be made lower profile, and a rotary-pair with high dimensional accuracy can be made. By extension, there can be produced a low-profile optical pickup apparatus having a superior optical characteristic.

An optical pickup apparatus according to the invention comprises: a semiconductor laser device comprising, a substrate having mutually-opposing first and second primary surfaces, a semiconductor laser element which is mounted on the first primary surface of the substrate and emits light having an optical axis along the primary surface, a wall member which is provided on the first primary surface of the substrate and surrounds the semiconductor laser element except for the direction of the optical axis of the light originating from the semiconductor laser element, and a rotary-pair surface for rotating the optical axis of the light originating from the semiconductor laser element around a light-emitting point on an exit end face of the semiconductor laser element in a direction along the primary surface of the substrate, wherein the semiconductor laser device emits light having an optical axis along the primary surface of the substrate; and an assembly substrate having optical components-of an optical system for collecting an optical beam originating from the semiconductor laser device onto an optical information recording medium, and a counterpart rotary-pair surface corresponding to the rotary-pair surface of the semiconductor laser device. Accordingly, angular alignment of optical axis of an optical beam originating from the semiconductor laser device is facilitated. Hence, the optical beam involving few angular misalignment with respect to the optical axis of an optical system provided on the assembly substrate can be converged onto an optical information recording medium. By extension, there can be constructed an optical pickup apparatus whose optical control is easy and which has a superior optical characteristic.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser device comprising:
 a substrate having mutually-opposing first and second primary surfaces;
 a semiconductor laser element which is mounted on the first primary surface of the substrate and which emits light on an optical axis that is along the first primary surface, the semiconductor laser element emitting light from an exit end face of the semiconductor laser element at a light-emitting point on the exit end face;

a wall member located on the first primary surface of the substrate, partially surrounding the semiconductor laser element, and including an opening along the direction of the optical axis of the light originating from the semiconductor laser element and through which the light passes; and a rotary-pair surface for rotating direction of the optical axis of the light emitted by the semiconductor laser element around an axis passing through the light-emitting point and transverse to the first primary surface of the substrate.

2. The semiconductor laser device according to claim 1, including a first notch section, having a width greater than dispersion of the light originating from the semiconductor laser element, disposed in a front edge of the substrate, and the exit end face of the semiconductor laser element is disposed adjacent to a bottom of the first notch section.

3. The semiconductor laser device according to claim 1, including a protuberance disposed on the first primary surface of the substrate, and wherein the semiconductor laser element is disposed on a top surface of the protuberance.

4. The semiconductor laser device according to claim 1, including a second notch section disposed in a side surface of the substrate, spaced away from the direction of optical axis of the light originating from the semiconductor laser element.

5. The semiconductor laser device according to claim 1, wherein the substrate includes the rotary-pair surface.

6. The semiconductor laser device according to claim 5, wherein the rotary-pair surface is a side surface of the substrate.

7. The semiconductor laser device according to claim 5, including a protuberance or recess on or in the first primary surface of the substrate, and the rotary-pair surface is a side surface of the protuberance or recess.

8. The semiconductor laser device according to claim 5, including a protuberance or recess on or in the second primary surface of the substrate, and the rotary-pair surface is a side surface of the protuberance or recess.

9. The semiconductor laser device according to claim 1, wherein the wall member includes the rotary-pair surface.

10. The semiconductor laser device according to claim 9, wherein the rotary-pair surface is a side surface of the wall member.

11. The semiconductor laser device according to claim 9, including a protuberance or recess on or in a top of the wall member, and the rotary-pair surface is a side surface of the protuberance or recess.

12. The semiconductor laser device according to claim 6, including a cooling fin on the second primary surface of the substrate.

13. The semiconductor laser device according to 9, including a cooling fin on the second primary surface of the substrate.

14. The semiconductor laser device according to claim 1, including a rotary-pair member on the second primary surface of the substrate, and wherein the rotary-pair surface is on the rotary-pair member.

15. The semiconductor laser device according to claim 14, wherein the rotary-pair surface is a side surface of the rotary-pair member.

16. The semiconductor laser device according to claim 14, including a protuberance or recess on or in a top of the rotary-pair member, and the rotary-pair surface is a side surface of the protuberance or recess.

17. The semiconductor laser device according to claim 14, wherein the rotary-pair member is molded resin.

18. The semiconductor laser device according to claim 1, wherein the wall member is molded resin.

19. The semiconductor laser device according to claim 1, wherein the substrate is metal.

20. An optical pickup apparatus comprising:

a semiconductor laser device comprising, a substrate having mutually-opposing first and second primary surfaces, a semiconductor laser element which is mounted on the first primary surface of the substrate and which emits light on an optical axis that is along the first primary surface, the semiconductor laser element emitting light from an exit end face of the semiconductor laser element at a light-emitting point on the exit end face, a wall member located on the first primary surface of the substrate, partially surrounding the semiconductor laser element, and including an opening along the direction of the optical axis of the light originating from the semiconductor laser element and through which the light passes, and a rotary-pair surface for rotating direction of the optical axis of the light emitted by the semiconductor laser element around an axis passing through the light-emitting point and transverse to the first primary surface of the substrate; and an assembly substrate having optical components of an optical system for collecting an optical beam originating from the semiconductor laser device onto an optical information recording medium, and a counterpart rotary-pair surface corresponding to the rotary-pair surface of the semiconductor laser device.

* * * * *